United States Patent
Bagschik et al.

(10) Patent No.: US 11,628,850 B2
(45) Date of Patent: Apr. 18, 2023

(54) SYSTEM FOR GENERATING GENERALIZED SIMULATION SCENARIOS

(71) Applicant: Zoox, Inc., Foster City, CA (US)

(72) Inventors: Gerrit Bagschik, Foster City, CA (US); Andrew Scott Crego, Foster City, CA (US); Aditya Pramod Khadilkar, Foster City, CA (US); Muhammad Farooq Rama, Santa Clara, CA (US); Siavosh Rezvan Behbahani, Redwood City, CA (US)

(73) Assignee: Zoox, Inc., Foster City, CA (US)

( * ) Notice: Subject to any disclaimer, the term of this patent is extended or adjusted under 35 U.S.C. 154(b) by 420 days.

(21) Appl. No.: 16/866,715

(22) Filed: May 5, 2020

(65) Prior Publication Data

US 2021/0347372 A1     Nov. 11, 2021

(51) Int. Cl.
| | |
|---|---|
| *B60W 50/06* | (2006.01) |
| *G06F 17/18* | (2006.01) |
| *B60W 60/00* | (2020.01) |
| *G06F 30/20* | (2020.01) |
| *G06V 20/56* | (2022.01) |

(52) U.S. Cl.
CPC ........ *B60W 50/06* (2013.01); *B60W 60/0025* (2020.02); *G06F 17/18* (2013.01); *G06F 30/20* (2020.01); *G06V 20/588* (2022.01); *B60W 2556/00* (2020.02)

(58) Field of Classification Search
CPC ............. B60W 50/06; B60W 60/0025; B60W 2556/00; G06F 17/18; G06F 30/20; G06F 30/15; G06V 20/588; G06V 20/56
See application file for complete search history.

(56) References Cited

U.S. PATENT DOCUMENTS

| | | | | |
|---|---|---|---|---|
| 4,914,568 | A * | 4/1990 | Kodosky | G09B 9/00 703/2 |
| 9,612,123 | B1 * | 4/2017 | Levinson | G01S 17/875 |
| 11,086,318 | B1 * | 8/2021 | Davis | G05D 1/0291 |
| 2013/0346047 | A1 * | 12/2013 | Fukushige | G06F 30/15 703/8 |
| 2014/0104051 | A1 * | 4/2014 | Breed | G01S 17/86 340/435 |

(Continued)

OTHER PUBLICATIONS

The PCT Search Report and Written Opinion dated Aug. 5, 2021 for PCT application No. PCT/US21/29855, 9 pages.

*Primary Examiner* — Richard M Camby
(74) *Attorney, Agent, or Firm* — Lee & Hayes, P.C.

(57) ABSTRACT

Techniques associated with generating simulation scenarios for simulating a vehicle controller are discussed herein. Log data may include sensor data captured by sensors of a vehicle. The log data may represent objects in an environment. Objects may be associated with a region of a discretized representation of the environment relative to the vehicle. Specific states of objects (relative position in a region type, velocity, classification, size, etc.) may represent an instance of an occupation. Log data can be aggregated based on similar region type and/or object state. A statistical model over object states can be determined for each region type and can later be sampled to determine simulation parameters. A simulation scenario can be generated based on the simulation parameters, and a vehicle controller can be evaluated based on the simulation scenario.

20 Claims, 10 Drawing Sheets

(56) References Cited

U.S. PATENT DOCUMENTS

| | | | | |
|---|---|---|---|---|
| 2016/0258845 | A1* | 9/2016 | Mankovskii | G06F 11/079 |
| 2016/0259869 | A1* | 9/2016 | Parikh | G05B 17/02 |
| 2016/0314224 | A1* | 10/2016 | Wei | G05D 1/0088 |
| 2017/0124781 | A1* | 5/2017 | Douillard | G01S 17/931 |
| 2021/0341921 | A1* | 11/2021 | Davis | G05D 1/0257 |

* cited by examiner

SYSTEM FOR GENERATING GENERALIZED SIMULATION SCENARIOS

BACKGROUND

Autonomous vehicles are becoming more and more common. These vehicles may define and navigate along routes without the assistance of a human driver. Various system have been developed to assist with testing, updating, and maintaining operational software and hardware of the autonomous vehicles to ensure safety and reliability prior to deployment of the vehicles.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

DETAILED DESCRIPTION

Figure 1:
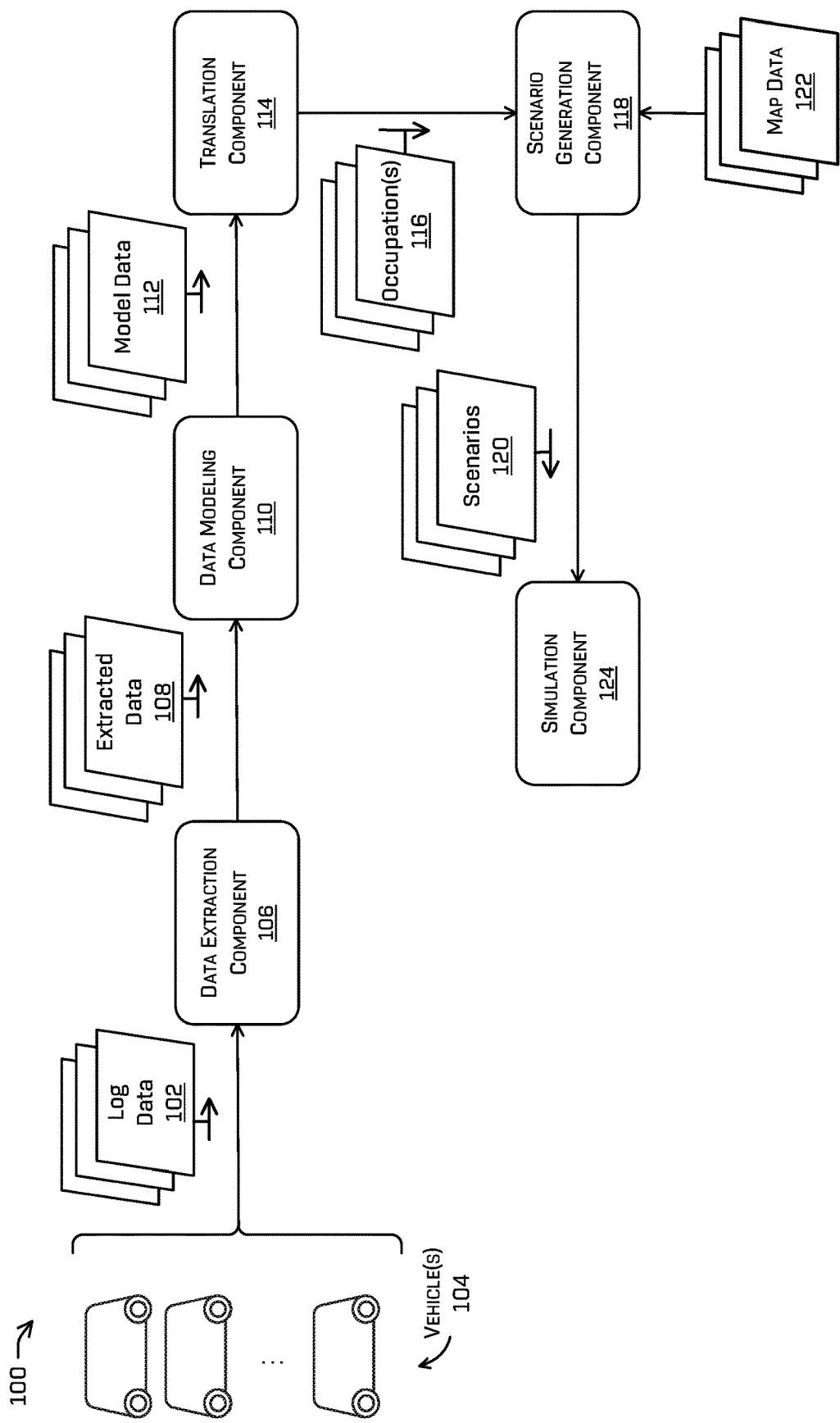
FIG. 1 is an example block-diagram illustrating an example architecture of a scenario generation system, in accordance with implementations of the disclosure.

Autonomous vehicles may navigate through physical environments along planned routes or paths. For example, when an autonomous vehicle receives a request to travel to a destination location, the autonomous vehicle may navigate along a planned path from the current location of the autonomous vehicle to a pickup location to pick up a passenger and then from the pickup location to the destination location. While navigating, the autonomous vehicle may encounter dynamic (e.g., vehicles, pedestrians, animals, and the like) and/or static (e.g., buildings, signage, parked vehicles, and the like) objects in the environment. In order to ensure the safety of the occupants and objects, the decisions and reactions of the autonomous vehicles to events and situations that the vehicle may encounter are modeled and simulated using a plurality of scenarios defined and output by a scenario generation system, discussed herein.

For instance, techniques described herein are directed to various aspects of generating simulation scenarios for determining performance metrics of the autonomous vehicles and/or systems and components of the vehicles. In at least some examples the performance metrics may be determined, for example, using simulations and machine modeling to validate software executed on vehicles and gather safety metrics to ensure that the software is able to safely control the autonomous vehicles in various scenarios that may be potentially encountered during normal operations.

In additional or alternative examples, simulations may be used to determine constraints or limitations of autonomous vehicles that may be used in the autonomous controllers, navigation systems, route or path planning systems, and the like. For instance, simulations may be used to understand the operational space of an autonomous vehicle in view of surface and/or environmental conditions, faulty components, etc. As a non-limiting example for illustration, use of the simulations may inform a planner system of a vehicle not to exceed a given acceleration or velocity based on a number of objects in the environment and/or presence of precipitation, etc. Simulations may also be used to capture and generate feedback for improving operations and designs of autonomous vehicles and the vehicles software. For instance, in some examples, simulations may be useful for determining an amount of redundancy that is required in various components of the autonomous vehicle, or how to modify a behavior of the autonomous vehicle based on what is learned through the results of one or more simulations. Furthermore, in additional or alternative examples, simulations may be useful to improve the hardware design of the autonomous vehicles, such as optimizing placement of sensors with respect to a chassis or body of the autonomous vehicle.

When creating scenarios for use in the simulation environment, it is possible to specifically enumerate the environment with various and specific examples. Each instantiation of a scenario may be unique and defined. However, enumerating or creating all possible scenarios manually requires inordinate amounts of time and may be prone to error (e.g., the possible permutations of an event or scenario is undefined). Thus, in manual scenario generation situations various scenarios may go untested. Additionally, the plurality of simulation scenarios that may be generated by the system are fully repeatable test scenarios that may be used to test various components of the vehicles in a consistent and repeatable manner to compile statistics over large sets of data. Further, as the simulation scenarios are generated, the scenarios may be tailored to represent tests that are not easily conducted in real world, such as when a scenario is an uncommon occurrence or just too dangerous to test in a live environment).

In some cases, the scenario generation system, discussed herein, may utilize sensor data captured by one or more vehicles during operations, to generate a hierarchy of possible arrangements of objects, object states, and parameters associated with the objects with respect to the operating vehicle that may be sampled at simulation time to generate a set of scenarios for a given event being tested. In some cases, the occupations may be sampled using a Gaussian mixture model based in part on a frequency of occurrence of each occupation with respect to sensor data or log data captured by operating vehicles (e.g., either or both autonomous or human controlled vehicles while driving in various traffic and environmental conditions). As discussed herein, the occupations are a discrete arrangement of objects with respect to a physical environment based on discretized template of region with respect to map data (e.g., the roadway being traveled by the capture vehicle) and/or the position of the vehicle within the map data. For example, log data representing bicycle in front of the autonomous vehicle (with no other objects around the vehicle) would represent a first type of occupation, while log data representing a bicycle in front of an autonomous vehicle and a second bicycle behind the autonomous vehicle (with no other objects around the vehicle) would represent a second type of occupation. In this manner, the log data may be assigned an occupation based on a template or predetermined arrangement of objects with respect to the autonomous vehicle. In other cases, the log data may be clustered or organized/arranged into a hierarchies associated with occupations based on the similarities between different log data files collected by different vehicles. As another example, first log data representing a bicycle in front of a first autonomous vehicle may be assigned to a first type of occupation. Likewise, second log data representing a bicycle in front of a second autonomous vehicle (e.g., either a different autonomous vehicle or the same autonomous vehicle at a different point of time) may also be assigned to the first type of occupation, as the object (e.g., the bicycle) is in the same position (or similar enough position) relative to the environment and the autonomous vehicle. Thus, each occupation may include multiple instances of the occupation corresponding to different log data (e.g., different physical environments, different times, and different capturing vehicles) having the same arrangement of object with respect to the vehicle.

In some examples, the scenario generation system may, based on the log data, determine various occupations, a frequency of the various occupations, and conditions of the environment that are associated with the various occupations. For example, the scenario generation system may parse log data received from one or more vehicles at regular time intervals (such as at a rate equal to a sensor spin or other predefined amount). For reach time interval, the scenario generation system may define a set of regions surrounding the vehicle. In some cases, the regions may be defined based on lanes designations within the environment and relative to the position of the vehicle capturing the sensor data and generating the log data.

The scenario generation system may determine or sample an existence of objects within each of the defined or discrete regions. For example, one or more objects may be present in each region. The objects may include, but are not limited to, pedestrians, bicycles/bicyclists, other vehicles (and in some cases types of vehicles, e.g., sedan, motorcycle, bus, truck, etc.), animals, static objects, and the like. The log data may include classifications associated with each object and/or the scenario generation system may classify the objects into one or more classifications. In some examples, the classifications may correspond to the type of object (e.g., pedestrians, bicycles/bicyclists, truck, motorcycle, animal, etc.) while in other examples, the classifications may be further limited to a predefined number of types. For instance, in one example, the types may be limited to three classifications including motorized vehicle, pedestrian, or static object to reduce complexity associated with generating scenarios.

Once the objects within each region are identified and classified, the scenario generation system may select or determine a representative object of each classification or type within each region. For example, if a first particular region (such as a region to the left of the vehicle) includes two motorized vehicles, the scenario generation system may select the motorized vehicle nearest to the vehicle capturing the sensor data and generating the log data as the representative object of the motorized vehicle type within the first particular region. As another illustrative example, if the second particular region (such as a region in front of the vehicle) includes a pedestrian and a motorized vehicle, the scenario generation system may assign the pedestrian as the representative object of the pedestrian within the second particular region and the motorized vehicle as the representative object of the vehicle type within the second particular region. It should be understood, that at each time interval, various regions may be empty or unoccupied.

The scenario generation system may extract parameters associated with each of the representative objects defined within each discrete region associated with the time interval. For example, the parameters may include, but are not limited to, velocity, heading or direction, acceleration, distance from the vehicle generating the log data, predicted trajectories, and the like. In some examples, the scenario generation system may also extract parameters associated with the vehicle generating the log data and environmental conditions or features in addition to the parameters associated with the representative objects.

The various region to representative object correspondence as well as, in some instances, the extracted parameters may be used to define an occupation for the event represented by the log data at the time interval. In other examples, the various region to representative object correspondence may be used to define an occupation for the event represented by the log data at the time interval and the extracted parameters may be associated with or otherwise used to describe the instance of the occupation. For instance, in the above example with representative objects in the first particular region and the second particular region, the occupation associated with the event may be defined as a vehicle and pedestrian in the region to the front of the autonomous vehicle and a vehicle in the region to the left of the autonomous vehicle. As such, when the scenario generation system generates scenarios associated with the occupation including the vehicle and pedestrian in a region to the front and a vehicle in a region to the left, the parameters associated with the particular or instance of the occupation type may be used as an input to a Gaussian Mixture model including the event above as well as parameters associated with other instances of the occupation having the same arrangement of representative objects. For example, Gaussian Mixture model may be generated using a frequency of occurrence of corresponding parameter sets of the various occupations matching the criterion set with regard to the simulation being modeled.

When generating the scenarios, the scenario generation system determine a criterion set for the simulation. The system may then sample the Gaussian Mixture model (or other statistical model) generated from the parameter sets of occupations matching the criterion set for the simulation based at least in part on a frequency of occurrence of the parameter sets associated with the occupations based on a number of desired scenarios. Once the scenarios are generated, the scenario generation system may fit each scenario to actual map data. For example, if the scenarios include a vehicle stopped at an intersection having two lanes in each direction, a turn lane, and a cross walk, the scenario generation system may identify map locations corresponding to the environmental conditions presented by the scenarios. Thus, it should be understood, that by generalizing lane data into regions relative to the vehicle and/or parameterizing the lanes, the scenario generation system is able to test the situation or event represented by an occupation in various different map or real life environments. For example, in some cases, the set of scenarios may be fit to a map location while in other cases, each scenario may be fit to a different map location. In some instances, the occupation data may be collected with respect to geographic areas in which the autonomous vehicles are currently operating and the scenarios may be fit to map data representing geographic areas that the autonomous vehicles are yet to encounter. In this manner, the vehicles decisions and reactions may be tested using additional or new map data prior to the vehicles being implemented in the corresponding geographic regions, thereby improving safety of the autonomous vehicles when being first exposed to a new environment. Thus, the system is able to generate statistics and results that may be used to evaluate the vehicles and the vehicles performance in regions, weather, climates, and conditions that have not been physically explored by the vehicles.

As used herein, the sensor data may represent objects and/or conditions of the physical environment encountered by an operating vehicle. In some instances, the sensor data may include data captured by sensors such as time-of-flight sensors, location sensors (e.g., GPS, compass, etc.), inertial sensors (e.g., inertial measurement units (IMUs), accelerometers, magnetometers, gyroscopes, etc.), lidar sensors, radar sensors, sonar sensors, infrared sensors, cameras (e.g., RGB, IR, intensity, depth, etc.), microphone sensors, environmental sensors (e.g., temperature sensors, humidity sensors, light sensors, pressure sensors, etc.), ultrasonic transducers, wheel encoders, etc. The log data can include sensor data captured by one or more sensors of the vehicle, perception data indicating objects identified by one or more systems onboard the vehicle (or produced during a post-processing phase), prediction data indicating an intent of objects (whether produced during the recording or subsequent thereto), and/or status data indicating diagnostic information, trajectory information, and other information generated by the vehicle. The vehicle may transmit the log data, via a network, to a database that stores log data and/or to a computing device that analyzes the log data.

FIG. 1 is an example block-diagram illustrating an example architecture of a scenario generation system 100, in accordance with implementations of the disclosure. As discussed above, synthetic scenario generation for use with simulation, modeling, and testing autonomous vehicles systems and software may assist with improving overall operations of the autonomous vehicles when encountering new or unexpected situations. In the current example, log data 102 may be received from one or more vehicles 104 operating on various roadways in real world conditions and environments. As discussed above the log data may include sensor data, perception data, prediction data, trajectory information, and the like.

The log data 102 may be processed by a data extraction component 106. The data extraction component 106 may be configured to parse log data received from one or more vehicles 104 based on a set time interval (e.g., every 40 milliseconds, every 80 milliseconds, every 200 milliseconds, etc.). For each time interval, the data extraction component 106 may define a set of regions surrounding the vehicle 104. In some cases, the regions may be defined based on lanes designations within the environment and relative to the position of the vehicle capturing the sensor data and generating the log data 102, as discussed below in more detail with respect to FIGS. 2 and 3.

In some implementations, the data extraction component 106 may determine an existence of objects within each of the defined or discrete regions. For example, one or more objects may be present in each region. The data extraction component 106 may then determine or identify a classification or type associated with each object in each region. The data extraction component 106 may then select or determine a representative object of each classification or type within each region. Parameters associated with the representative objects and the vehicle 104 as well as features of the environment may be extracted from the log data 102 by the data extraction component 106. For example, the vehicle parameters may include, but are not limited to, current drive mode, current drive state, planned maneuver, total velocity, total acceleration, longitudinal acceleration, lateral acceleration, distance to an intersection, longitudinal acceleration, lateral acceleration, yaw, yaw rate, lane identifier, road identifier, Euclidian position, and the like.

The extracted data 108 (e.g., the regions, representative objects, parameters, features, etc.) may then be modeled such as by a statistical modeling technique or, in some cases, by using one or more stochastic model, by a data modeling component 110. For example, the data modeling component 110 may associate the extracted data 108 corresponding to each time interval represented by the log data 102 to one or more models in order to generate model data 112. In some cases, the model data 112 may be sparse data associated with events or arrangements of objects, parameters, and object states relative to the vehicle. In some cases, the data modeling component 110 may perform filtering to remove or prevent non-relevant or impossible/improbable data (such as log data representing physically impossible parameters) from being incorporated into instances of the occupations 116. For example, the data modeling component 110 may filter data that represents measurements or distances outside of defined threshold or limitations (e.g., removing data representing a vehicle that is 25 meters long).

A translation component 114 may receive the model data 112 to generate occupations 116 which may include vectorized model data 112 defining the existence of representative objects in the occupation 116 and the corresponding parameters for each representative object. The occupations 116 may include more dense data than the model data 1122. For instance, the occupations 116 may include parameters and states of objects that were not encountered or present in the log data 102. For example, if the model data 112 represented a first bicycle to the left of the vehicle traveling at 5 miles per hour and a second bicycle to the left of the vehicle traveling at 15 miles per hour, the occupations 116 may represent the first bicycle, the second bicycle, and a third bicycle traveling at 10 miles per hour (or any velocity between 5 and 15 miles per hour or proximate to 5 and 15 miles per hour). In some cases, the model data 112 may also comprise parameters associated with the vehicle itself, and features of the physical environment from which the log data 102 was generated.

In some cases, the translation component 114 may determine frequency of occurrence measurements for various occupations 116 within a family or occupation hierarchy. For instance, the occupations 116 may be stored based on the arrangement of objects relative to the predefined regions and/or the vehicle. As one possible illustrative example, the occupations 116 may forma hierarchy of occupations based on an occupancy of the regions or the position of the objects relative to the vehicle. In some cases, the broader or large tiers of the hierarchy may form the top tiers in a reverse pyramid structure. For instance, a first tier or level of the hierarchy may be defined as all occupations in which a first region is occupied by a first type of object regardless of the presence of other objects or the parameters or states associated with the objects. The hierarchy may also include a first sub tier or level that includes the first region occupied by the first type of object and a second region occupied by a second type of object and a second sub tier or level in which the first region is occupied by the first type of object and the first region is occupied by a second type of object. Thus, a frequency of occurrence related to occupations in which the region to the front of the vehicle is occupied by a motorized vehicle may be determine based on the number and arrangement of sub-occupations within the hierarchy. For example, the simulation criterion may indicate that the desired scenarios include a region to the front of the vehicle is occupied by a motorized vehicle. In this example, a first occupation type in which the region to the front of the vehicle occupied by the motorized vehicle and the region to the left of the vehicle is occupied by a bicycle and a second occupation type in which the region to the front of the vehicle occupied by the motorized vehicle and the region to the right of the vehicle is occupied by a bicycle may meet the simulation criterion. Additionally, the first occupation type may occur twice as often as the second occupation type. Thus, the system 110 may ultimately generate twice as many scenarios 120 corresponding to the first occupation type than the second occupation type. In some implementations, the probability sampler component 114 may be configured to recreate or generate additional occupations 116 using the model data 112 and previously generated occupations 116 to extend simulation coverage and scenario generation over missing combinations of representative objects and/or parameters. For example, the probability sampler component 114 may combine model data 112 of a first occupation 116 in which a vehicle occupies the region to the right of the vehicle with model data 112 of a second occupation 116 in which a pedestrian occupies the region to the rear of the vehicle to generate a third occupation 116 including both the vehicle to the front and the pedestrian to the rear of the vehicle. In this manner, the aggregated occupations may still be based on log data 102 generate from sensor data captured by vehicles operating on the roadways.

The scenario generation component 118 may utilize parameters or states of objects corresponding to the occupations 116 (e.g., the vectorized data) that match or meet simulation criterion to generate a Gaussian mixture model. The scenario generation component 118 may then sample the Gaussian mixture model in order to generate the simulation scenarios 120. In some examples, the scenario generation component 118 may be configured to receive as an input or otherwise access map data 122 of actual roads and physical environment. The scenario generation component 118 may then fit the scenarios 120 and/or arranged representative objects based on corresponding parameters (velocity, distance from the vehicle, associated region, direction of travel or trajectory, etc.) to the map data 122, such that the scenario 120 is feasible at the selected map location or environment.

A simulation component 124 may receive or access the scenario 120 in order to generate and execute simulations of various components and software of autonomous vehicles in order to capture or collect simulation data. For example, the scenario data may be used by the simulation component 124 to simulate variations of the desired situation represented by the simulation criterion. For example, the simulation component 124 may execute a variation of the vectorized scenario data in a simulation for testing and validation. As an example, details associated performing simulated testing may be discussed in U.S. application Ser. No. 16/708,019, which is herein incorporated by reference in its entirety. The simulation component 124 may also generate performance data indicating how the tested autonomous vehicle performed (e.g., responded) and may compare the simulation data to a predetermined outcome and/or determine if any predetermined rules/assertions were broken/triggered.

Figure 2:
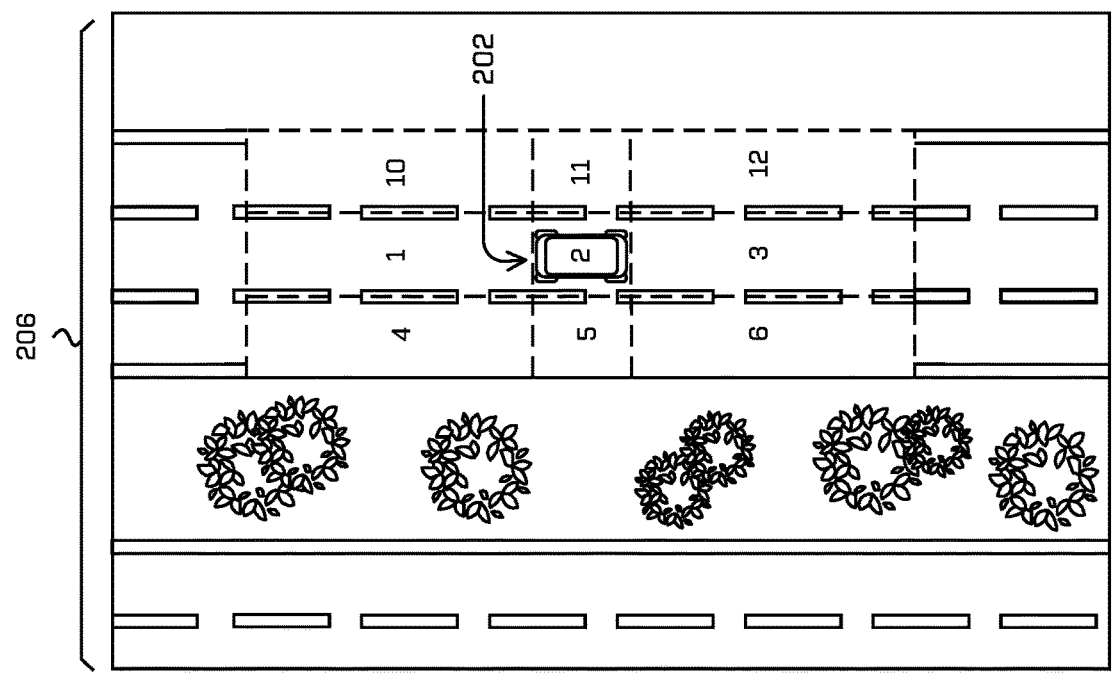
FIG. 2 is an example pictorial view of environments that have been segmented into discretized regions, in accordance with implementations of the disclosure.
Figure 2:
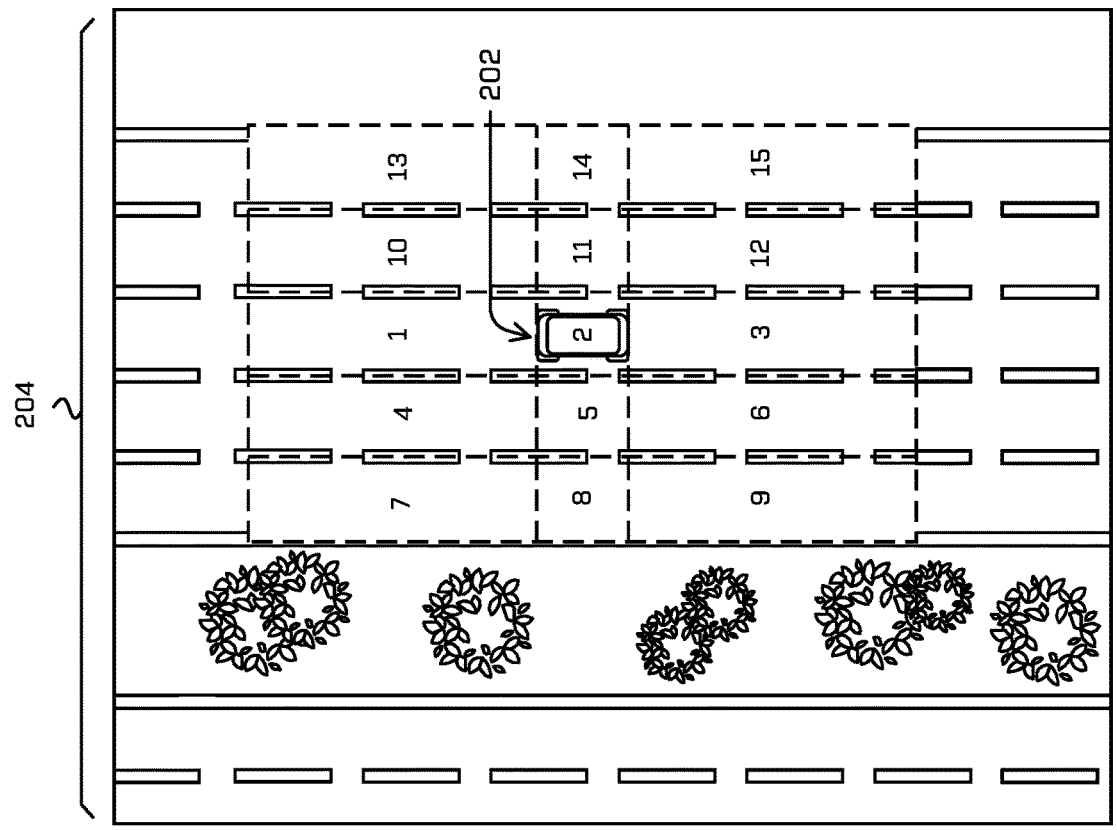

FIG. 2 is an example pictorial view 200 of environments 204 and 206 that have been segmented into discretized regions, in accordance with implementations of the disclosure. In the current example, the environment 204 may be a ten-lane divided highway in which the vehicle 202 generating the log data is occupying the middle lane of the north bound traffic. Similarly, the environment 206 may include a six-lane divided highway in which the vehicle 202 is again occupying the middle lane.

In the current example, the vehicle 202 is occupying region 2 in both the environment 204 and the environment 306, as the regions are fixed about the position of the vehicle 202 relative to the environment. In this example, the environment 204 may be divided or otherwise segmented into 15 regions including the region 2 occupied by the vehicle 202. In this manner, there are two regions on the left side of the vehicle 202 (e.g., region 5 and 8) and two regions to the right side of the vehicle 202 (e.g., regions 11 and 14). Additionally, regions 1, 4, 7, 10, and 13 are in front of the vehicle 202 and regions 3, 6, 9, 12, and 15 are to the rear of the vehicle 202. However, as the environment 206 includes a smaller road (e.g., fewer lanes), the environment 206 is divided or otherwise segmented into 9 regions, as illustrated. It should be understood and as shown, in both environments 204 and 206, the vehicle 202 occupies region 2, the region to the left of the vehicle is region 5, the region to the right of the vehicle is region 11, the region to the front of the vehicle is region 1, and the region to the rear of the vehicle is region 3. Thus, it should be understood, that the regions may be in a fixed arrangement regardless of the size (e.g. number of lanes) associated with the occupied roadway. In some examples, the width of the regions may be fit to width of the corresponding lane, as shown. In some cases, the length of the regions 1-15 may be uniform. However, in the current case, a length of the region 2 occupied by the vehicle 202 as well as the regions 5, 8, 11, and 14 to either side of the vehicle 202 are based on the length of the vehicle 202, while a length of the regions 1, 4, 7, 10, and 13 and the regions 3, 6, 9, 12, and 15, respectively, to the front and rear of the vehicle 202 may be based on a sensor distance (such as 50 meters, 80 meters, 100 meters, etc.). In the current example, the length of the regions 1, 4, 7, 10, and 13 and the regions 3, 6, 9, 12 to the front and rear are the same but in some implementations, the vehicle 202 may have greater visibility to the front or to the rear which may result in the regions to the front being longer or shorter than the regions to the rear. In other examples, the length of one or more of the regions 1-15 may be based on the time interval used by the extraction component in segmenting the log data and/or based on a rate associated with one or more of the sensors onboard the vehicle 202.

Figure 3:
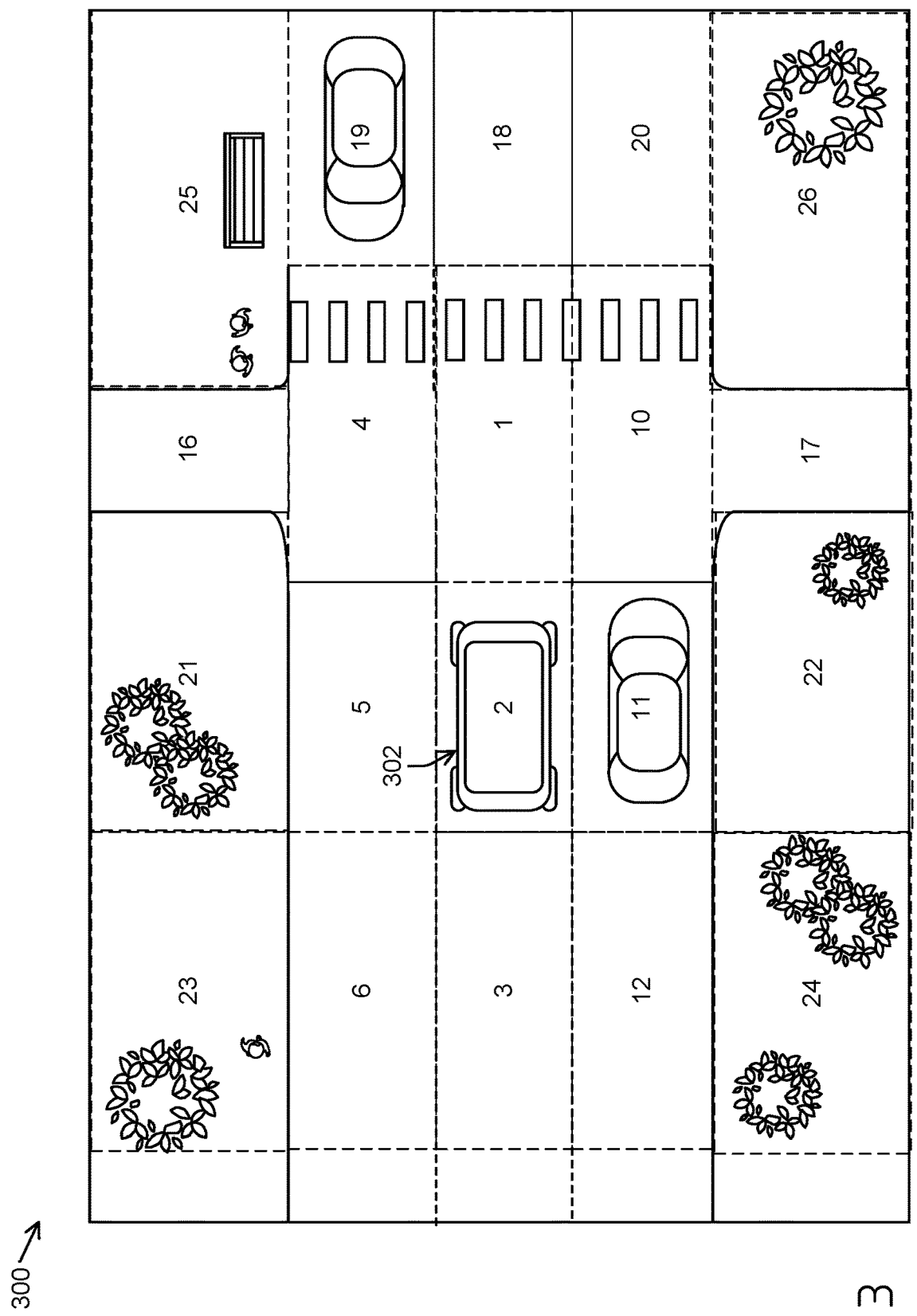
FIG. 3 is another example pictorial view of an environment that has been segmented into discretized regions, in accordance with implementations of the disclosure.

FIG. 3 is another example pictorial view of an environment 300 that has been segmented into discretized regions, in accordance with implementations of the disclosure. In the current example, the vehicle 302 is occupying a turn lane of a segment of road having three-lanes (e.g., a lane moving in each direction and a turn lane). Unlike the previous example, only one region (e.g., regions 5 and 11) exist to the left and right of the vehicle 302. Similarly, the extraction component may define three regions (e.g., regions 1, 4, and 10) to the front of the vehicle 302 and three regions (e.g., regions 3, 6, and 12) to the back of the vehicle 302. It should be understood, that in some implementations, the extraction component may define the regions in a consistent manner, such that the same region is in the same position relative to the vehicle 302 regardless of the details of the environment 300 to assist with assigning occupations and generating scenarios from the occupations. In the current example, environment 300 may be an intersection which may result in a more complex scenario or additional parameters and/or environmental conditions for the vehicle 302 to consider when making operational decisions. In these types of environments 300 including an intersection, the extraction component may define additional regions, such as regions 16 and 17 along the intersecting roadway and regions 18, 19, and 20 across the intersection. Each of these additional regions may again be occupied by one or more types of representative objects, as discussed herein.

In the current example, regions 11 and 19 are occupied by objects. In this example, the extraction component may sample, extract, and/or classify the objects within the occupied regions to determine the representative objects for use in generating the occupation associated with the log data/time interval. As illustrated, the extraction component may identify the object in both the region 11 and the region 19 as a vehicle type representative object. The extraction component may also determine parameters from the log data associated with the representative objects, such as velocity, acceleration, distance from the vehicle 302, predicted direction of travel, and the like. Thus, the occupation assigned to the currently illustrated log data/time interval may be vehicle in region 19 and vehicle in region 11 with the environmental feature of an intersection.

In some implementations, the extraction component may also assign regions to either side of the roadway. For instance, in the illustrated example, the regions 21 and 22 may be fit to the environment to the left and right of the vehicle 302 and not included in a lane. The regions 23 and 24 may be assigned to the environment behind the vehicle 302 and not included in the lane (e.g., to the right or left of the lanes). Additionally, in this example, the regions 25 and 26 may be assigned to the environment in front of the vehicle 302 and not included in a lane (e.g., to the right or left of the lanes). In this example, the regions 25 and 6 may be the areas outside of the lanes and on the opposing side of the intersection from the vehicle 302. In this manner, the simulation scenarios generated using the corresponding log data may be used to consider, for instance, the pedestrians 304 and 305 in region 25 that may be entering the cross walk represented within region 1, 4, and 10.

Figure 4:
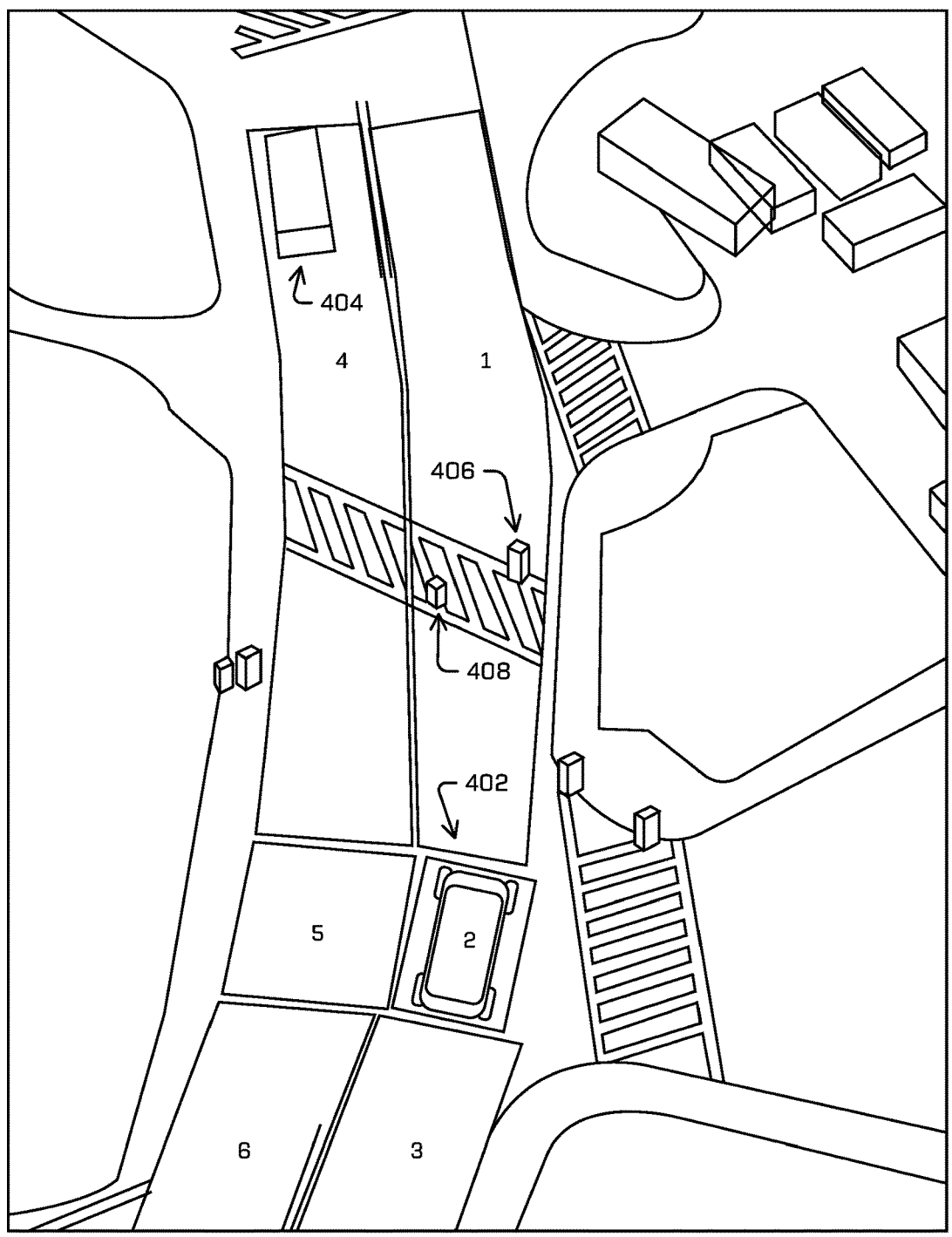
FIG. 4 is another example pictorial view of an environment that has been segmented into discretized regions, in accordance with implementations of the disclosure.

FIG. 4 is another example pictorial view of an environment 400 that has been segmented into discretized regions, in accordance with implementations of the disclosure. In the current example, the environment 400 is represented in a manner to reflect the state of the environment 400 as understood by the vehicle 402 and as represented in the log data received by the extraction component. In the current example, the objects represented by the log data, such as objects 404-408, may be generic geometric shapes or outer bounding boxes of the objects 404-408. Additionally, as shown, the extraction component may define or fit the discretized regions to the lanes and presented geography or geometry of the environment 400. For example, the regions may be adjusted based on lane width, curvature, elevation, tilt, banks, shoulder width, etc. Thus, as illustrated, the regions 4 and 1 may be curved to fit the actual geometry of the corresponding lane.

In the current example, the extraction component may identify object 404 in region 4 and objects 406 and 408 in region 1. The extraction component may determine a type or class associated with each object. For instance, the extraction component may determine the object 404 is a vehicle, the object 406 is a pedestrian, and the object 408 is an animal (such as a dog). As discussed above, the extraction component may also determine an representative object of each type or class within each of the occupied regions. For example, the vehicle 404 may be the sole representative object within region 4, while both the pedestrian 406 and the animal 408 may be categorized as representative objects within the region 1. The extraction component may also determine parameters associated with each of the objects 404-408, such as velocity, acceleration, distance from the vehicle 302, predicted direction of travel, and the like.

Figure 5:
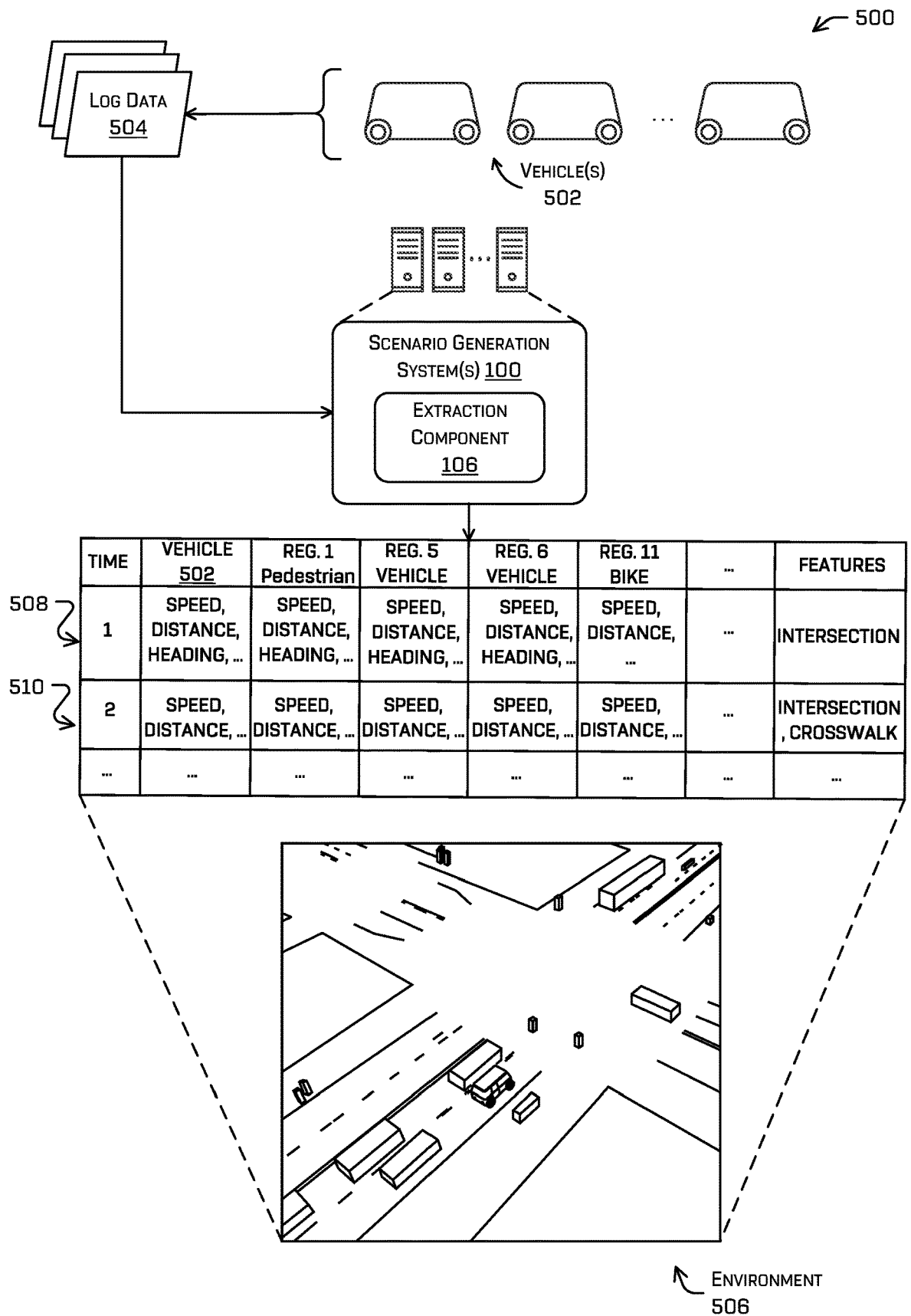
FIG. 5 illustrates an example of vehicles generating log data and transmitting the log data to the scenario generation systems of FIG. 1, in accordance with implementations of the disclosure.

FIG. 5 illustrates an example 500 of vehicles 502 generating log data and transmitting the log data 504 to the scenario generation systems 100 of FIG. 1, in accordance with implementations of the disclosure. As discussed above, an extraction component 106 of the scenario generation system 100 may parse or sample the log data 504 at predetermined intervals of time in order to generate occupations that correspond to the situations encountered by the vehicles 502 and may be utilized to generate scenarios for use in testing simulations. As discussed above, the log data 504 may include sensor data generated by one or more sensors of the vehicle(s) 502 and/or perception data generated by a perception system of the vehicle(s) 502. In some cases, the perception data may include types and/or classifications of objects represented by the sensor data as well as parameters, features, and/or characteristics of the objects and the environment 506 represented by the log data 504.

As discussed above, the extraction component 106 may generate an occupation, such as illustrated occupations 508 and 510, for each time interval of the log data 504. In this manner, each occupation represents the situation of the environment 506 at the time corresponding to the time interval. For example, at the second time interval corresponding to the environment 506 the occupation 510 may, at least in part, include a pedestrian representative object in region 1, a vehicle representative object in region 5, a vehicle representative object in region 6 and a bicycle representative object in region 11 (e.g., within a bike lane of the roadway). The occupation 510 may also include environmental features, such as an intersection and a cross walk.

Figure 6:
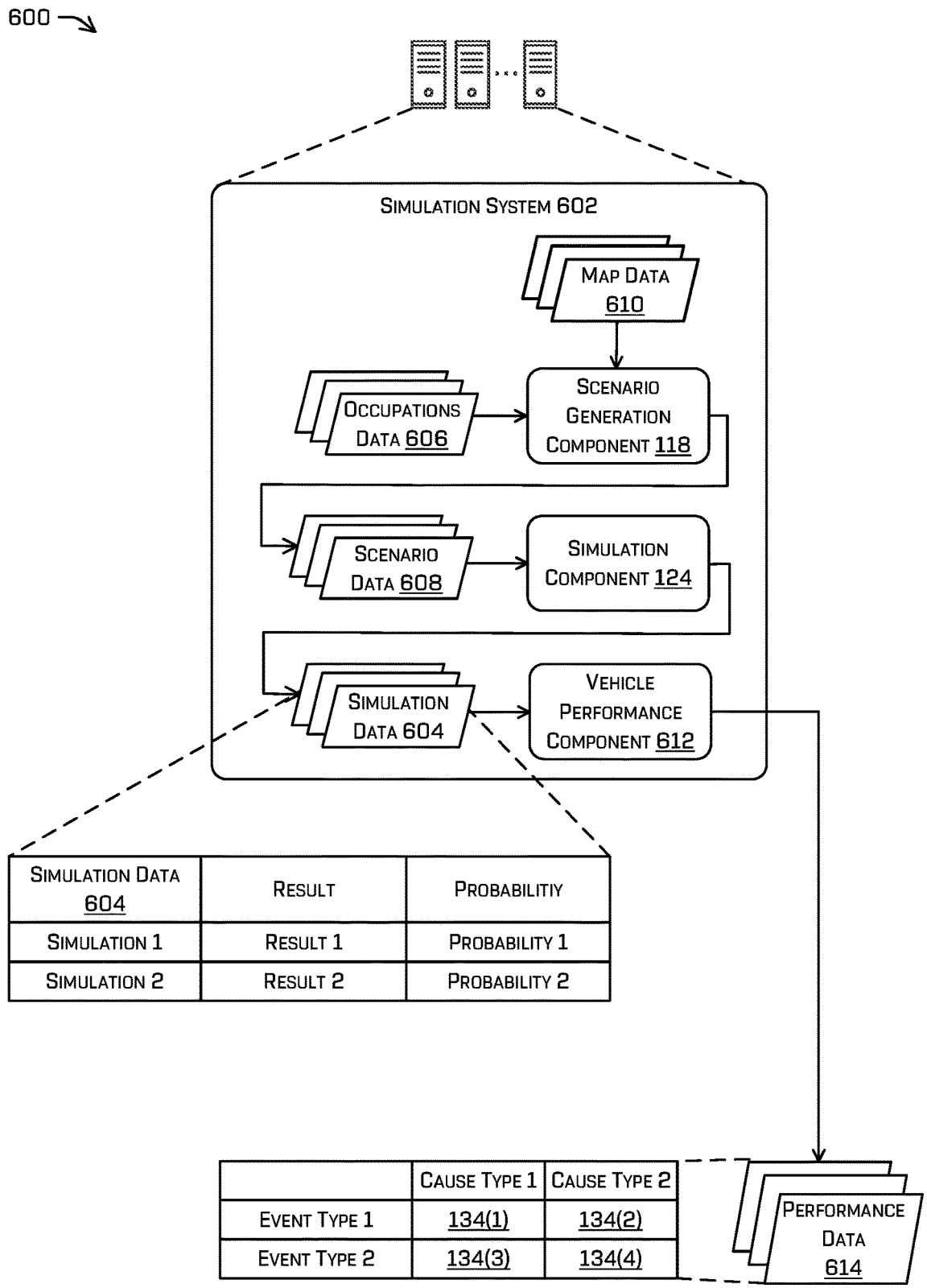
FIG. 6 illustrates an example of a system for generating simulation data from the occupation data generated by the extraction component of FIGS. 1 and 5 and determining vehicle performance data from the simulation data.

FIG. 6 illustrates an example 600 of a system 602 for generating simulation data 604 from the occupation data 606 generated by the extraction component of FIGS. 1 and 5 and determining vehicle performance data 614 from the simulation data 604. The scenario generation component 118 may access the occupations data 606 to identify occupations that match or meet simulation criterion. The scenario generation component 118 may generate from the occupation data 606 a Gaussian mixture model representative of the sampled occupations. The scenario generation component 118 may then sample the Gaussian mixture model to generate scenario data 608. For example, the scenario generation component 118 may, based on the representative object parameters, the set of regions, occupation of the regions, and one or more machine learned models, determine the scenario data 608.

In some examples, the scenario generation component 118 may be configured to receive as an input or otherwise access environment or map data 610 of actual roads. The scenario generation component 118 may then fit the scenario data 608 including the arrangement of representative objects with respect to the vehicle based on corresponding parameters (velocity, distance from the vehicle, associated region, direction of travel or trajectory, etc.) of the representative objects to the map data 610.

In some examples, the number of stored occupations meeting a simulation criterion may be less than a number of scenarios desired for testing. For instance, as one illustrative example, the simulation criterion may be to generate at least 1,250 scenarios in which a first vehicle is occupying region 16, a second vehicle is occupying region 2, and a bicyclist is occupying region 1. In this example, the system 602 may store 1000 occupations in which a vehicle is occupying region 16, 1000 occupations in which a vehicle is occupying region 2, and 1000 occupations in which a bicyclist is occupying region 1. The system 602 may also store 500 occupations in which a first vehicle occupies region 16 and a second vehicle occupies region 2. However, the system 602 may only store 50 occupations in which the first vehicle is occupying region 16, the second vehicle is occupying region 2, and the bicyclist is occupying region 1. Thus, in this illustrative example, the 50 occupations meeting the simulation criterion does not amount to the desired 1,250 scenarios. In this instance, the scenario generation component 118 may generate augmented occupations meeting the simulation criterion by combining the 1000 occupation in which the bicyclist is occupying region 1 with the 500 occupations in which a first vehicle occupies region 16 and a second vehicle occupies region 2. As a result, the scenario generation component 118 may input 1500 occupations into to the Gaussian Mixture model in order to have a more diverse scenario sampling.

A simulation component 124 may receive or access the scenario data 608 in order to generate and execute simulations of various components and software of autonomous vehicles in order to capture or collect simulation data 604. For example, the scenario data 608 may be used by the simulation component 124 to simulate variations of the desired situation represented by the simulation criterion. For example, the simulation component 124 may execute a variation of the vectorized scenario data 608 in a simulation for testing and validation. The simulation component 124 may generate the simulation data 604 indicating how the tested autonomous vehicle performed (e.g., responded) and may compare the simulation data 604 to a predetermined outcome and/or determine if any predetermined rules/assertions were broken/triggered.

As illustrated in FIG. 6, the simulation data 604 may indicate a number of simulations (e.g., simulation 1, simulation 2, etc.) and the result of the simulations (e.g., result 1, result 2). For example, as described above, the result may indicate a pass or a fail based on rules/assertions that were broken/triggered. Additionally, the simulation data 604 may indicate a probability of encountering the scenario. By way of example and without limitation, the simulation component 124 may simulate a scenario that includes a jaywalking pedestrian. In some instances, the simulation component 124 may identify variations of the scenario that have a low probability and execute simulations that correspond to those variations. For example, the scenario data 608 may include a frequency of occurrence associated with the corresponding occupation, such as 0.01% of occupations matching the simulation criterion include a pedestrian in region 1 having a velocity above a threshold amount. In some cases, to ensure the operational safety and performance of the vehicle, the simulation system 602 may target the low percentage occupations when sampling the Gaussian Mixture model resulting in scenarios including the low probability occupation being executed by the simulation component 124. This can allow testing and verification of the autonomous vehicle's components. Based on the simulation data 604, the vehicle performance component 612 may generate the vehicle performance data 614. As discussed above, for example, for a simulated scenario, the performance component 612 may include or indicate a safety rating, such as a threshold has met or exceed. As an example, details associated with the simulation component 124 and/or the vehicle performance component 612 may be discussed in U.S. application Ser. Nos. 16/586,838 and 16/586,853, which are herein incorporated by reference in their entirety.

Figure 7:
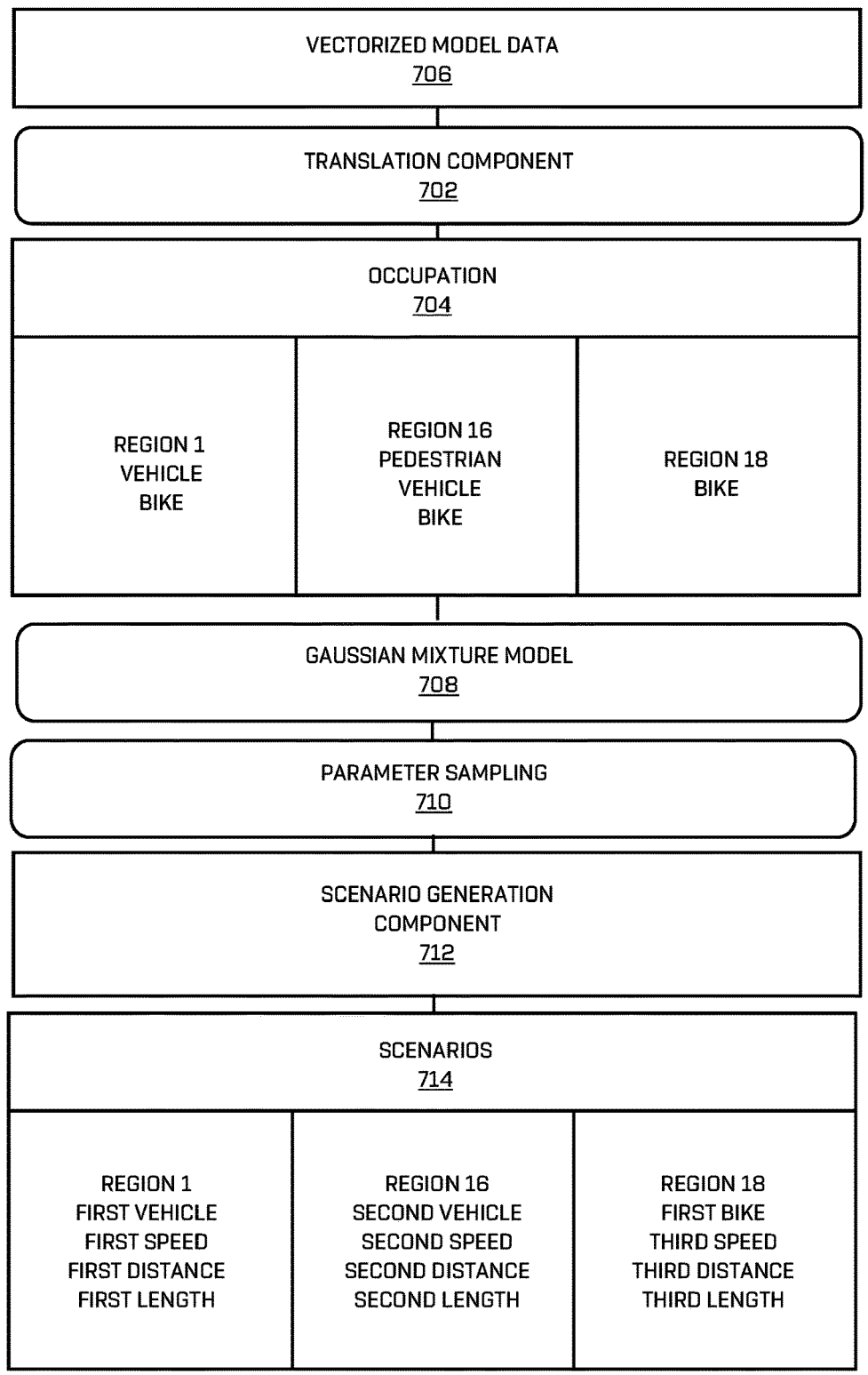
FIG. 7 is an example block-diagram illustrating an example architecture associated with generating scenarios for simulated testing, in accordance with implementations of the disclosure.

FIG. 7 is an example block diagram illustrating an example architecture 700 associated with generating scenarios for simulated testing, in accordance with implementations of the disclosure. As discussed above, a translation component 702 may generate occupations 704 using vectorized model data 706 extracted from log data received from one or more vehicles operating on the roadways. The vectorized model data 706 may include parameters such as, but not limited to, representative object type, region, longitudinal velocity of the representative object, lateral velocity of the representative object, longitudinal acceleration of the representative object, lateral acceleration of the representative object, distance from vehicle (e.g., region 2), distance to an intersection, a longitudinal extent of the representative object, a lateral extent of the representative object, a vertical extent of the representative object, a longitudinal position of the representative object, a lateral position of the representative object, a vertical position of the representative object, a yaw of the representative object, a yaw rate of the representative object, a heading or direction of travel of the representative object, a speed of the representative object, and the like. In some cases, the vectorized model data 706 may also include parameters associated with the vehicle being tested. These parameters may include, but are not limited to, current drive mode, current drive state, planned maneuver, total velocity, total acceleration, longitudinal acceleration, lateral acceleration, distance to an intersection, longitudinal acceleration, lateral acceleration, yaw, yaw rate, lane identifier, road identifier, Euclidian position, and the like.

Each of the occupations 704 may correspond to a particular situation encountered by a vehicle generating log data during operations on actual roadways. The occupations 704 may be arranged based on regions of occupancy, representative objects occupying the regions, parameters associated with the occupying representative objects, and the like. In the illustrated example, the occupation 704 may be represented as having three occupied regions 1, 16, and 18, as discussed above with respect to FIG. 2. Region 1 may include two representative objects a vehicle and bicyclist (as each region may include one representative object of each type or class). Region 16 may also include three representative objects a pedestrian, a vehicle, and a bicyclist. Region 18 may include a single representative object, for example, the bicyclist as illustrated. Again, each representative object associated with the occupation may include a vectorized set of parameters.

In some implementations, a Gaussian mixture model 708 may be generated using the parameters and states of the objects from the occupations 704. The Gaussian Mixture model 708 may then be used to perform parameter sampling 710. The sampled parameters 710 may then be used by a scenario generation component 712 to the scenario 714 that may be used to preform simulated testing, as discussed above with respect to FIG. 6 above. For instance, in the illustrated example, one scenario 714 generated by the scenario generation component 712 from the sampled parameters 710 may include a situation including two vehicles and a bicycle. The first vehicle may be in the first region as the occupation 704 includes a vehicle representative object in region 1 and may include parameters, such as a first speed, first distance, and first length, among others. The second vehicle may be in region 16 and also have parameters, such as a second speed, second distance, and second length, among others. The first bicyclist may be in region 18 and have parameters, such as a third speed, third distance, and third length, among others. In this example, each scenario 714 may include at least one bicyclist as the only representative object in region 18 of the occupation 704 is a bicyclist but the representative objects in the scenarios 714 in region 1 and 16 may vary as additional representative objects are present in these regions in the occupation 704.

In the current example, the parameter sampling 710 from the Gaussian mixture model 708 may reflect a frequency of occurrence of the occupations 704 used to generate the Gaussian mixture model 708. For example, if 50% of the occupations 704 used to generate the Gaussian mixture model 708 include a bicyclist in region 18, then approximately 50% of the scenarios 714 generated may include a bicyclist in region 18.

Figure 8:
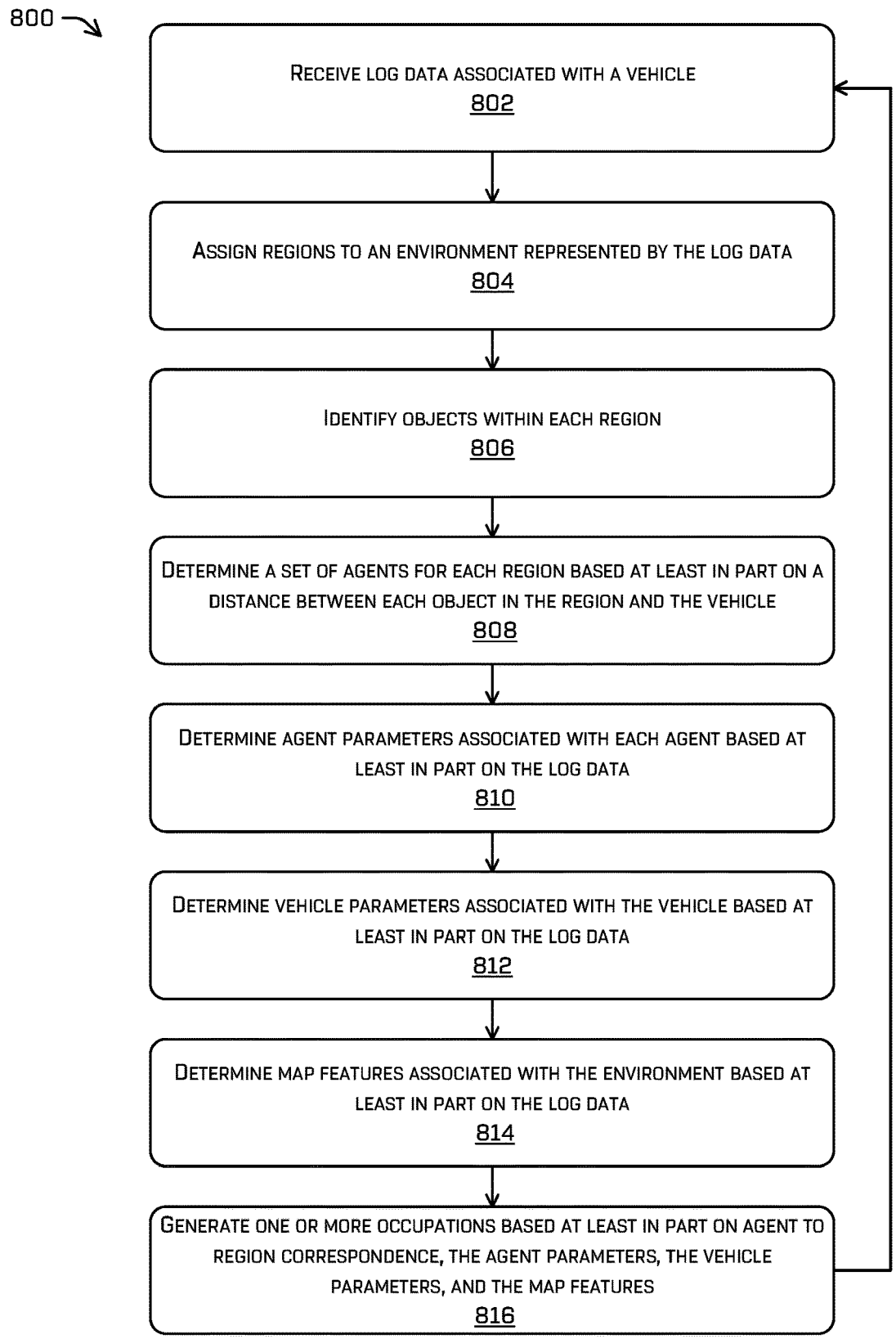
FIG. 8 is a flow diagram illustrating an example process associated with the occupation extraction and generation, in accordance with implementations of the disclosure.
Figure 9:
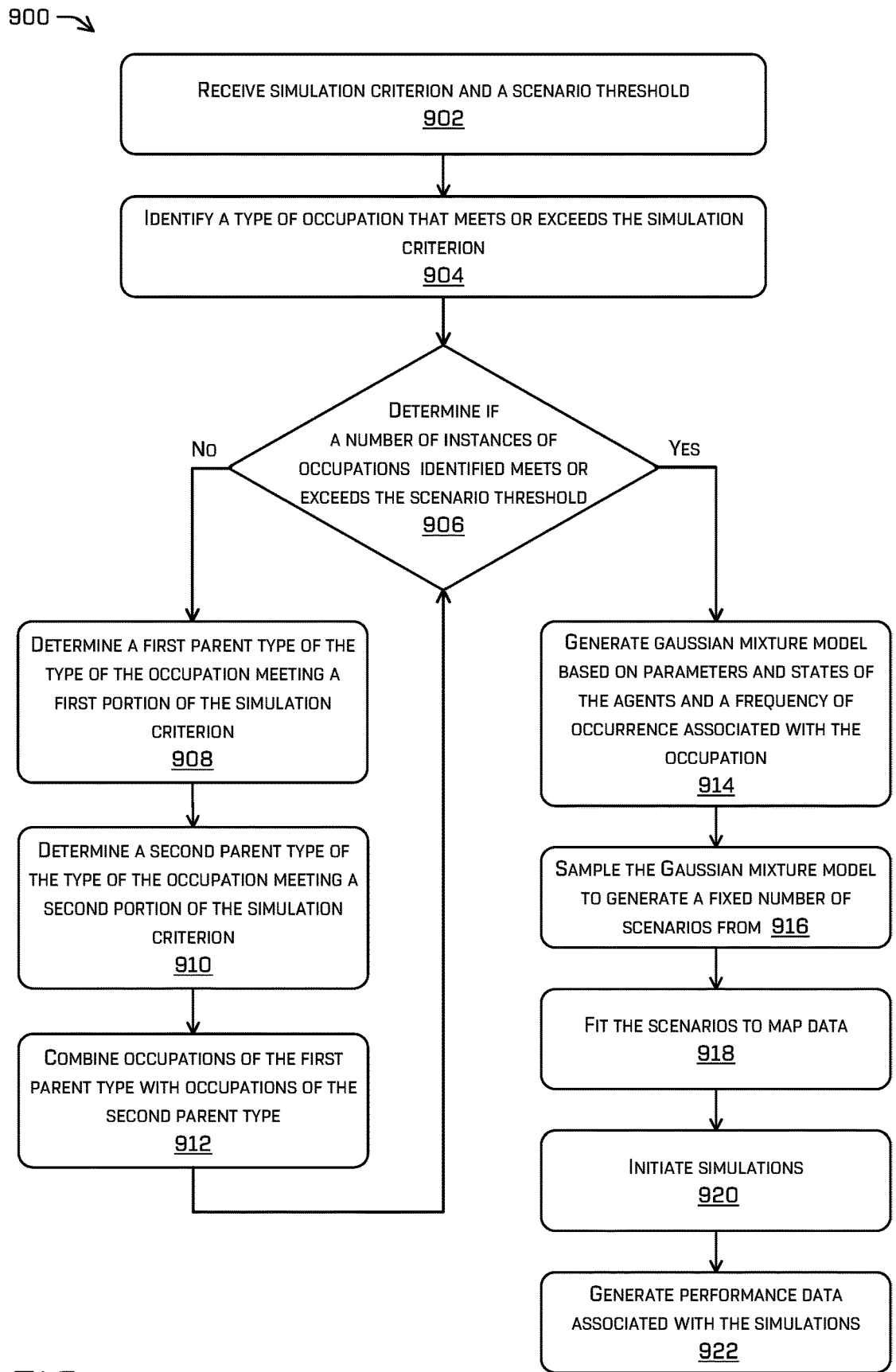
FIG. 9 is another flow diagram illustrating an example process associated with the generating scenarios from occupation data, in accordance with implementations of the disclosure.

FIGS. 8 and 9 are flow diagrams illustrating example processes associated with the collision prediction system discussed above. The processes are illustrated as a collection of blocks in a logical flow diagram, which represent a sequence of operations, some or all of which can be implemented in hardware, software, or a combination thereof. In the context of software, the blocks represent computer-executable instructions stored on one or more computer-readable media that, which when executed by one or more processors, perform the recited operations. Generally, computer-executable instructions include routines, programs, objects, components, encryption, deciphering, compressing, recording, data structures and the like that perform particular functions or implement particular abstract data types.

The order in which the operations are described should not be construed as a limitation. Any number of the described blocks can be combined in any order and/or in parallel to implement the processes, or alternative processes, and not all of the blocks need be executed. For discussion purposes, the processes herein are described with reference to the frameworks, architectures and environments described in the examples herein, although the processes may be implemented in a wide variety of other frameworks, architectures or environments.

FIG. 8 is a flow diagram illustrating an example process 800 associated with the occupation extraction and generation, in accordance with implementations of the disclosure. As discussed above, scenario generation for use with simulation, modeling, and testing autonomous vehicles systems and software may assist with improving overall operations of the autonomous vehicles when encountering new or unexpected situations. In some cases, utilizing actual data collected by operating vehicles to generate the scenarios may be desirable to improve the overall quality and reliability of the simulations.

At 802, a scenario generation system may receive log data associated with a vehicle. The vehicle may be operating on the roadways and configured to capture sensor data associated with the environment as well as, in some cases, to process the sensor data to generate perception data and/or prediction data including for example, data segmentation, object identification, classification, and predicted outcomes (e.g., motions, trajectories, etc.). For instance, details of classification and/or segmentation are discussed in U.S. application Ser. Nos. 16/238,475 and 16/732,243, which are herein incorporated by reference in their entirety. In some cases, the scenario generation system may determine a time interval associated with the log data. For example, the scenario generation system may segment the log data into discrete points in time. In some cases, the points in time may be based on a predetermined time interval. In one instance, the interval may be based on a data collection rate of one or more sensors (e.g., an image capture device, a lidar capture device, a radar capture device, etc.) and/or processing systems (e.g., a perception system, prediction system, object tracking system, etc.) equipped on the vehicle. In other cases, the points in time may be associated with detecting specific events (e.g., approaching an intersection, presence of a pedestrian, entering an on-ramp, etc.).

At 804, the scenario generation system may assign regions to an environment resented by the log data. For example, as discussed above with respect to FIGS. 2-4, the scenario generation system may fit the regions to the environment based on a position of the vehicle, predefined arrangement of regions, and the geometries of the lanes of the occupied road. For example, if the vehicle is in a turn lane of two-lane road, the scenario generation system may assign regions 1-3 to the turn lane, 4-6 to the oncoming traffic lane, and 10-12 to the parallel lane of traffic. In some cases, the regions may be curved, such as when the lane curves as shown in FIG. 4 above.

At 806, the scenario generation system may identify the objects within each region. In some cases, the objects may be identified within the log data, such as when the log data includes perception data. In other cases, the scenario generation system may perform segmentation and classification techniques on sensor data of the log data to identify the objects and to locate the objects within the environment at the time. In some cases, the scenario generation system may utilize the regions and the objects to associate the objects with each region.

At 808, the scenario generation system may determine a set of representative objects for each region based at least in part on a distance between each object in the region and the vehicle. For example, the scenario generation system may assign a representative object to each region for each type or classification. For instance, if a region includes a first pedestrian fifteen meters from the vehicle and a second pedestrian twenty meters from the vehicle, the scenario generation system may assign the first pedestrian as the representative object of the pedestrian type to the region. In another illustrative instance, if a region includes a first pedestrian fifteen meters from the vehicle and a first bicyclist twenty meters from the vehicle, the scenario generation system may assign the first pedestrian as the representative object of the pedestrian type and the first bicyclist as the representative object of the bicyclist type to the region. Thus, some regions may have more than one representative object, but each region has only one representative object of each type or class.

At 810, the scenario generation system may determine representative object parameters associated with each representative object based at least in part on the log data. For example, the scenario generation system may determine extra parameters such as, but not limited to, representative object type, region, longitudinal velocity of the representative object, lateral velocity of the representative object longitudinal acceleration of the representative object, lateral acceleration of the representative object, distance from vehicle (e.g., region 2), distance to an intersection, a longitudinal extent of the representative object, a lateral extent of the representative object, a vertical extent of the representative object, a longitudinal position of the representative object, a lateral position of the representative object, a vertical position of the representative object, a yaw of the representative object, a yaw rate of the representative object, a heading or direction of travel of the representative object, a speed of the representative object, and the like for each representative object in each region. In some cases, the scenario generation system may store the list of parameters for each representative object as a vector or indexed list.

At 812, the scenario generation system may determine vehicle parameters associated with the vehicle based at least in part on the log data. For example, the vehicle parameters may include, but are not limited to, current drive mode, current drive state, planned maneuver, total velocity, total acceleration, longitudinal acceleration, lateral acceleration, distance to an intersection, longitudinal acceleration, lateral acceleration, yaw, yaw rate, lane identifier, road identifier, Euclidian position, and the like.

At 814, the scenario generation system may determine map features associated with the environment based at least in part on the log data. For example, the map features may include road or lane features, such as intersection, cross walk, one-way road, two-way road, four-way road, turn lane, bike lane, shoulder width, etc. as well as environmental features, such as weather conditions (e.g., snow, fog, rain, sun, etc.), time of day, visibility, temperature, inclines, static elements (e.g., trees, bushes, median barrier, cliff, etc.).

At 816, the scenario generation system may generate one or more occupations based at least in part on a representative object to region correspondence, the representative object parameters, the vehicle parameters, and the map features. In some cases, the system may generate a first level occupation corresponding to each region occupied. For instance, in one illustrative example, if region 1 was occupied by a vehicle and region 11 was occupied by a pedestrian, the system may generate an occupation in which region 1 is occupied by a vehicle and a second occupation in which region 11 is occupied by a pedestrian. The system may also generate more specific occupations, such as region 1 occupied by a vehicle and region 11 occupied by a pedestrian. For each occupation, the system may generate a vectorized list of regions, representative objects, and parameters/features. Once the occupations are assigned, the system may return to 804 and a second time interval may be applied to the log data and additional occupations may be extracted.

FIG. 9 is another flow diagram illustrating an example process 900 associated with generating scenarios from occupation data, in accordance with implementations of the disclosure. In some cases, the scenario generation system may be configured to generate scenarios that may be used to simulate operations and decisions of an autonomous vehicle and determine performance metrics or data associated with an autonomous vehicle based on results and/or outputs of the simulations.

At 902, the scenario generation system may receive simulation criterion and a scenario threshold. In some cases, the simulations criterion may include one or more of indications of occupied regions, indications of representative object types within the regions, desired representative object parameters, desired vehicle parameters, desired map features, and the like. The scenario threshold may include a desired number of occupations to include for sampling.

At 904, the scenario generation system may identify a type of occupation that meets or exceeds the simulation criterion. In some cases, the type of an occupation may be the set of occupations having regions occupied by a particular type of representative object. For instance, the simulation criterion may include regions 14 occupied by a pedestrian, region 5 occupied by a vehicle, and region 11 occupied by a pedestrian and a bicyclist and a matching type of occupation may include each occupation in which at least regions 14 is occupied by a pedestrian, region 5 is occupied by a vehicle, and region 11 is occupied by both a pedestrian and a bicyclist.

At 906, the scenario generation system may determine if the number of instances of occupations identified meet or exceed the scenario threshold. For example, if the number of instances or data points (e.g., discrete periods of time having the objects arranged in the desired manner) associated with the occupations of the type is less than the scenario threshold, then the process 900 may advance to 908. For instance, if the scenario threshold was 1500 occupations and the total number of occupations of the type was 500 then the process 900 would move to 908. Otherwise, if the number of occupations of the type is equal to or greater than the scenario threshold the process 900 proceeds to 914.

At 908, the scenario generation system may determine a first parent type to the type of occupation meeting a first portion of the simulation criterion. For instance, as stated above, in one example, the simulation criterion may include regions 14 occupied by a pedestrian, region 5 occupied by a vehicle, and region 11 occupied by a pedestrian and a bicyclist and the number of occupations meeting the criterion may be 500. In this example, one of the parent types of occupation may be regions 14 occupied by a pedestrian and region 5 occupied by a vehicle and include 1000 matching occupations.

At 910, the scenario generation system may determine a second parent type to the type of occupation meeting a second portion of the simulation criterion. For instance, in the current example, the second parent type may be occupations in which the region 11 is occupied by a pedestrian and a bicyclist. The second parent type may include another 600 occupations.

At 912, the scenario generation system may combine the occupations of the first parent type with the occupations of the second parent type. For example, the scenario generation system may combine the 1000 occupations of the first parent type with the 600 occupations of the second parent type to generate at least 1500 occupations meeting the simulation criterion (e.g., regions 14 occupied by a pedestrian, region 5 occupied by a vehicle, and region 11 occupied by a pedestrian and a bicyclist). The process 900 may then return to 906 and determines that the number of occupations does meet or exceed the scenario threshold and, thus, advance to 914. However, if the two parent occupations also fail to generate sufficient occupations to meet or exceed the scenario threshold, the process 900 may repeat 908-912 continuing to look at higher level parent types until the scenario threshold is meet or exceeded.

At 914, the scenario generation system may generate a Gaussian mixture model based on parameters and states of the agents (or objects) within the selected occupations and frequency of each occupation. For example, the scenario generation system may generate the a gaussian distribution based on the occurrence and frequency of occurrence of parameters within the occupations identified or generated to meet the simulation criterion.

At 916, the scenario generation system may sample the Gaussian mixture model to generate an affixed number of scenarios. For example, the scenario generation system may sample each scenario from different areas or locations of the Gaussian mixture model to generate a range of scenarios meeting the simulation criterion but having various different types of parameters to provide a good set of scenarios for use in simulations.

At 918, the scenario generation system may fit the scenarios to map data. For example, the scenario generation system may fit each scenario to a location or environment in which the parameters, regions, and occupancy is physical feasible. For example, the system may refrain from placing a pedestrian in a middle lane of a highway or a vehicle traveling 90 miles an hour on a curvy road with a 25 mile per hour speed limit.

At 920, the scenario generation system may initiate the simulations. For example, the scenario generation system may test the software, components, or models using the scenarios granted from the Gaussian mixture model. In some cases, the scenario generation system may capture data as each scenario is executed.

At 922, the scenario generation system may generate performance data associated with the simulations. For example, the scenario generation system may process the simulation data in order to generate the performance data. In some cases, the performance data may include, but is not limited to, operational efficiencies (e.g., time efficiencies, resource efficiencies, etc.), safety ratings (e.g., a threshold being met or exceed or a percentage value representing a number of simulations or scenarios in which the threshold was met or exceeded), performance v. benchmarks (e.g., comparison of performance between prior software, components, and models) and the like.

Figure 10:
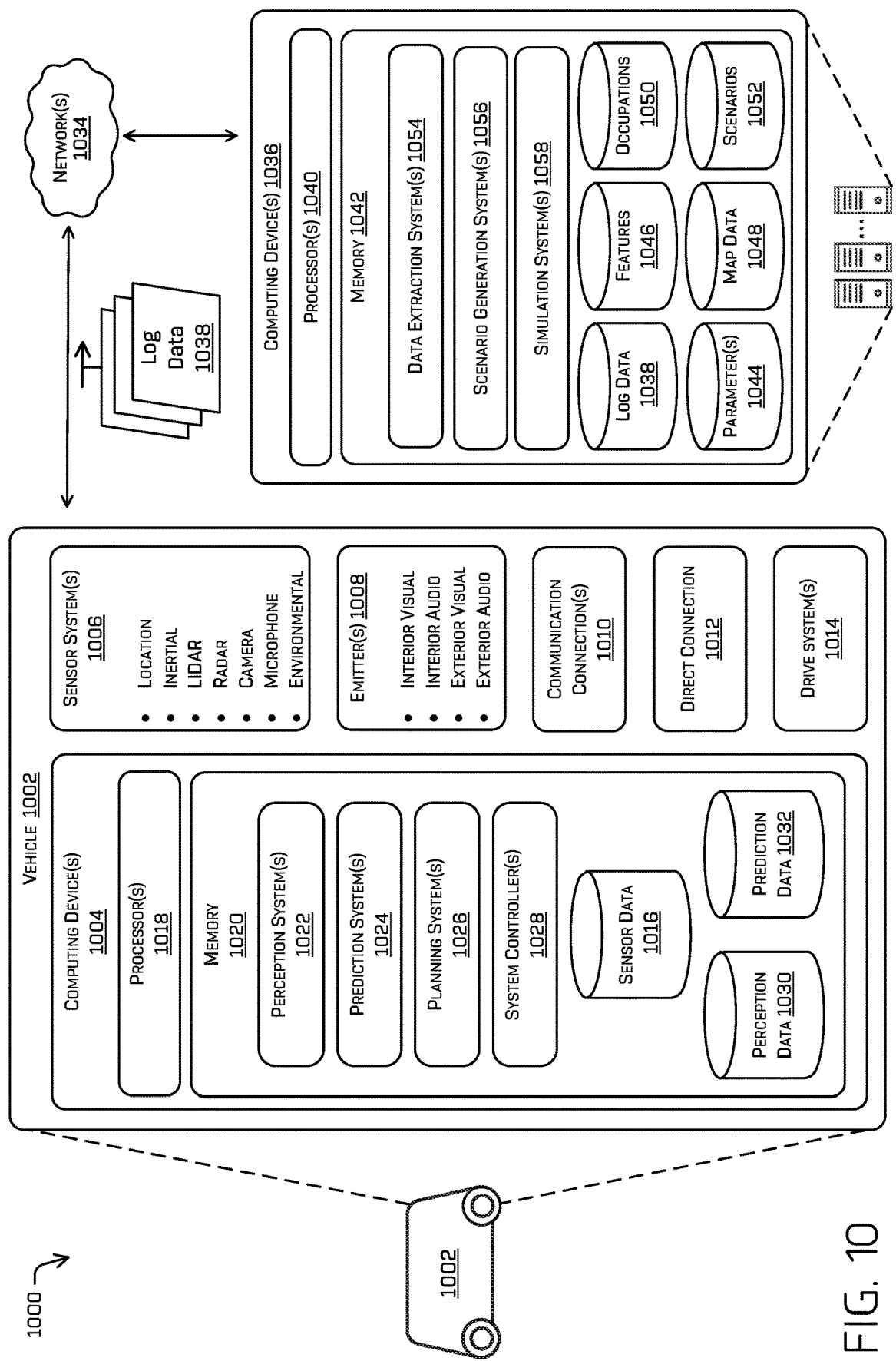
FIG. 10 depicts a block diagram of an example system for implementing the techniques discussed herein.

FIG. 10 depicts a block diagram of an example system 1000 for implementing the techniques discussed herein. In at least one example, the system 1000 may include a vehicle 1002, such the autonomous vehicles discussed above. The vehicle 1002 may include computing device(s) 1004, one or more sensor system(s) 1006, one or more emitter(s) 1008, one or more communication connection(s) 1010 (also referred to as communication devices and/or modems), at least one direct connection 1012 (e.g., for physically coupling with the vehicle 1002 to exchange data and/or to provide power), and one or more drive system(s) 1014. The one or more sensor system(s) 1006 may be configured to capture the sensor data 1016 associated with a surrounding physical environment.

In at least some examples, the sensor system(s) 1006 may include time-of-flight sensors, location sensors (e.g., GPS, compass, etc.), inertial sensors (e.g., inertial measurement units (IMUs), accelerometers, magnetometers, gyroscopes, etc.), lidar sensors, radar sensors, sonar sensors, infrared sensors, cameras (e.g., RGB, IR, intensity, depth, etc.), microphone sensors, environmental sensors (e.g., temperature sensors, humidity sensors, light sensors, pressure sensors, etc.), ultrasonic transducers, wheel encoders, etc. In some examples, the sensor system(s) 1006 may include multiple instances of each type of sensors. For instance, time-of-flight sensors may include individual time-of-flight sensors located at the corners, front, back, sides, and/or top of the vehicle 1002. As another example, camera sensors may include multiple cameras disposed at various locations about the exterior and/or interior of the vehicle 1002. In some cases, the sensor system(s) 1006 may provide input to the computing device(s) 1004.

The vehicle 1002 may also include one or more emitter(s) 1008 for emitting light and/or sound. The one or more emitter(s) 1008 in this example include interior audio and visual emitters to communicate with passengers of the vehicle 1002. By way of example and not limitation, interior emitters can include speakers, lights, signs, display screens, touch screens, haptic emitters (e.g., vibration and/or force feedback), mechanical actuators (e.g., seatbelt tensioners, seat positioners, headrest positioners, etc.), and the like. The one or more emitter(s) 1008 in this example also include exterior emitters. By way of example and not limitation, the exterior emitters in this example include lights to signal a direction of travel or other indicator of vehicle action (e.g., indicator lights, signs, light arrays, etc.), and one or more audio emitters (e.g., speakers, speaker arrays, horns, etc.) to audibly communicate with pedestrians or other nearby vehicles, one or more of which may comprise acoustic beam steering technology.

The vehicle 1002 can also include one or more communication connection(s) 1010 that enable communication between the vehicle 1002 and one or more other local or remote computing device(s) (e.g., a remote teleoperations computing device) or remote services. For instance, the communication connection(s) 1010 can facilitate communication with other local computing device(s) on the vehicle 1002 and/or the drive system(s) 1014. Also, the communication connection(s) 1010 may allow the vehicle 1002 to communicate with other nearby computing device(s) (e.g., other nearby vehicles, traffic signals, etc.).

The communications connection(s) 1010 may include physical and/or logical interfaces for connecting the computing device(s) 1004 to another computing device or one or more external network(s) 1034 (e.g., the Internet). For example, the communications connection(s) 1010 can enable Wi-Fi-based communication such as via frequencies defined by the IEEE 802.11 standards, short range wireless frequencies such as Bluetooth, cellular communication (e.g., 2G, 3G, 4G, 4G LTE, 5G, etc.), satellite communication, dedicated short-range communications (DSRC), or any suitable wired or wireless communications protocol that enables the respective computing device to interface with the other computing device(s). In at least some examples, the communication connection(s) 1010 may comprise the one or more modems as described in detail above.

In at least one example, the vehicle 1002 may include one or more drive system(s) 1014. In some examples, the vehicle 1002 may have a single drive system 1014. In at least one example, if the vehicle 1002 has multiple drive systems 1014, individual drive systems 1014 may be positioned on opposite ends of the vehicle 1002 (e.g., the front and the rear, etc.). In at least one example, the drive system(s) 1014 can include one or more sensor system(s) 1006 to detect conditions of the drive system(s) 1014 and/or the surroundings of the vehicle 1002. By way of example and not limitation, the sensor system(s) 1006 can include one or more wheel encoders (e.g., rotary encoders) to sense rotation of the wheels of the drive systems, inertial sensors (e.g., inertial measurement units, accelerometers, gyroscopes, magnetometers, etc.) to measure orientation and acceleration of the drive system, cameras or other image sensors, ultrasonic sensors to acoustically detect objects in the surroundings of the drive system, lidar sensors, radar sensors, etc. Some sensors, such as the wheel encoders may be unique to the drive system(s) 1014. In some cases, the sensor system(s)

1006 on the drive system(s) 1014 can overlap or supplement corresponding systems of the vehicle 1002 (e.g., sensor system(s) 1006).

The drive system(s) 1014 can include many of the vehicle systems, including a high voltage battery, a motor to propel the vehicle, an inverter to convert direct current from the battery into alternating current for use by other vehicle systems, a steering system including a steering motor and steering rack (which can be electric), a braking system including hydraulic or electric actuators, a suspension system including hydraulic and/or pneumatic components, a stability control system for distributing brake forces to mitigate loss of traction and maintain control, an HVAC system, lighting (e.g., lighting such as head/tail lights to illuminate an exterior surrounding of the vehicle), and one or more other systems (e.g., cooling system, safety systems, onboard charging system, other electrical components such as a DC/DC converter, a high voltage junction, a high voltage cable, charging system, charge port, etc.). Additionally, the drive system(s) 1014 can include a drive system controller which may receive and preprocess data from the sensor system(s) 1006 and to control operation of the various vehicle systems. In some examples, the drive system controller can include one or more processor(s) and memory communicatively coupled with the one or more processor(s). The memory can store one or more modules to perform various functionalities of the drive system(s) 1014. Furthermore, the drive system(s) 1014 also include one or more communication connection(s) that enable communication by the respective drive system with one or more other local or remote computing device(s).

The computing device(s) 1004 may include one or more processors 1018 and one or more memories 1020 communicatively coupled with the processor(s) 1018. In the illustrated example, the memory 1020 of the computing device(s) 1004 stores perception systems(s) 1022, prediction systems(s) 1024, planning systems(s) 1026, as well as one or more system controller(s) 1028. The memory 1020 may also store data such as sensor data 1016 captured or collected by the one or more sensors systems 1006, perception data 1030 associated with the processed (e.g., classified and segmented) sensor data 1016, prediction data 1032 associated with one or more predicted state of the environment and/or detected objects within the environment. Though depicted as residing in the memory 1020 for illustrative purposes, it is contemplated that the perception systems(s) 1022, prediction systems(s) 1024, planning systems(s) 1026, as well as one or more system controller(s) 1028 may additionally, or alternatively, be accessible to the computing device(s) 1004 (e.g., stored in a different component of vehicle 1002 and/or be accessible to the vehicle 1002 (e.g., stored remotely).

The perception system 1022 may be configured to perform object detection, segmentation, and/or classification on the sensor data 1016. In some examples, the perception system 1022 may generate processed perception data 1030 from the sensor data 1016. The perception data 1030 may indicate a presence of objects that are in physical proximity to the vehicle 1002 and/or a classification or type of the objects (e.g., car, pedestrian, cyclist, building, tree, road surface, curb, sidewalk, unknown, etc.). In additional and/or alternative examples, the perception system 1022 may generate or identify one or more characteristics associated with the objects and/or the physical environment. In some examples, characteristics associated with the objects may include, but are not limited to, an x-position, a y-position, a z-position, an orientation, a type (e.g., a classification), a velocity, a size, a direction of travel, etc. Characteristics associated with the environment may include, but are not limited to, a presence of another object, a time of day, a weather condition, a geographic position, an indication of darkness/light, etc. For example, details of classification and/or segmentation associated with a perception system are discussed in U.S. application Ser. No. 15/820,245, which are herein incorporated by reference in their entirety.

The prediction system 1024 may be configured to determine a track corresponding to an object identified by the perception system 1022. For example, the prediction system 1024 may be configured to predict a velocity, position, change in trajectory, or otherwise predict the decisions and movement of the identified objects. For example, the prediction system 1024 may include one or more machine learned models that may, based on inputs such as object type or classification and object characteristics, output predicted characteristics of the object at one or more future points in time. For example, details of predictions systems are discussed in U.S. application Ser. Nos. 16/246,208 and 16/420,050, which are herein incorporated by reference in their entirety.

The planning system 1026 may be configured to determine a route for the vehicle 1002 to follow to traverse through an environment. For example, the planning system 1026 may determine various routes and paths and various levels of detail based at least in part on the objects detected, the predicted characteristics of the object at future times, and a set of safety requirements corresponding to the current scenario (e.g., combination of objects detected and/or environmental conditions). In some instances, the planning system 1026 may determine a route to travel from a first location (e.g., a current location) to a second location (e.g., a target location) in order to avoid an object obstructing or blocking a planned path of the vehicle 1002. In some case, a route can be a sequence of waypoints for traveling between the two locations (e.g., the first location and the second location). In some cases, waypoints include streets, intersections, global positioning system (GPS) coordinates, etc. For example, details of path and route planning by the planning system are discussed in U.S. application Ser. Nos. 16/805,118 and 15/632,208, which are herein incorporated by reference, in its entirety.

In at least one example, the computing device(s) 1004 may store one or more and/or system controllers 1028, which may be configured to control steering, propulsion, braking, safety, emitters, communication, and other systems of the vehicle 1002. The system controllers 1028 may communicate with and/or control corresponding systems of the drive system(s) 1014 and/or other components of the vehicle 1002, which may be configured to operate in accordance with a route provided from the planning system 1026.

In some implementations, the vehicle 1002 may connect to computing device(s) 1036 via the network(s) 1034. For example, the computing device(s) 1036 may receive log data 1038 from one or more vehicles 1002. The log data 1038 may include the sensor data, perception data 1030, prediction data 1032 and/or a combination thereof. In some cases, the log data 1038 may include portion of one or more of the sensor data, perception data 1030, prediction data 1032.

The computing device 1036 may include one or more processors 1040 and memory 1042 communicatively coupled with the one or more processors 1040. In at least one instance, the processor(s) 1040 may be similar to the processor(s) 1018 and the memory 1042 may be similar to the memory 1020. In the illustrated example, the memory 1042 of the computing device(s) 1036 stores the log data 1038 received from one or more vehicles 1002. The memory 1042 may also store parameters 1044 associated with objects and/or the vehicle 1002 represented in the log data 1038, features 1046 associated with the environment represented in the log data 1038, map data 1048, occupations 1050 determined from the log data 1038, and scenarios 1052 generated based at least in part on the occupations 1050. The memory 1042 may also store a data extraction system 1054, scenario generation system 1056, and simulation system 1058.

The data extraction system 1054 may be configured to parse log data 1038 received from one or more vehicles 1002 based on a set of time intervals (e.g., every 40 milliseconds, every 80 milliseconds, every 200 milli sections, etc.). For reach time interval, the data extraction system 1054 may define a set of regions surrounding the vehicle 1002. In some cases, the regions may be defined based on lanes, designations within the environment, and relative to the position of the vehicle capturing the sensor data and generating the log data 1038. In some implementations, the data extraction system 1054 may determine or sample an existence of objects within each of the defined or discrete regions. For example, one or more objects may be present in each region. The data extraction system 1054 may then determine or identify a classification or type associated with each object in each region. The data extraction component 1054 may then select or determine an representative object of each classification or type within each region and extra the parameters 1044 associated with the representative objects and the vehicle 1002 as well as features 1046 of the environment from the log data 1038. In some cases, the data extraction system 1054 and/or the data modeling component may also generate the occupations 1050.

The scenario generation system 1056 may select the occupations 1050 that match or meet simulation criterion to generate a Gaussian Mixture model that may be sampled to generate the scenarios 1052. In some examples, the scenario generation component 1056 may be configured to receive as an input or otherwise access map data 1048 of actual roads and physical environment. The scenario generation system 1056 may then fit the scenarios 1052 and/or arranged representative objects associated with the scenarios 1048 based on corresponding parameters 1044 (velocity, distance from the vehicle, associated region, direction of travel or trajectory, etc.) to the map data 1048, such that each scenario 1052 is physical feasible or possible at the selected map location or environment.

A simulation system 1058 may receive or access the scenarios 1052 in order to generate and execute simulations of various components and software of autonomous vehicles in order to capture or collect simulation data. For example, the scenario data may be used by the simulation system 1058 to simulate variations of the desired situation represented by the simulation criterion. For example, the simulation system 1058 may execute a variation of the vectorized scenario data in a simulation for testing and validation. The simulation system 1058 may also generate performance data indicating how the tested autonomous vehicle performed (e.g., responded) and may compare the simulation data to a predetermined outcome and/or determine if any predetermined rules/assertions were broken/triggered.

The processor(s) 1018 of the computing device(s) 1004 and the processor(s) 1040 of the computing device(s) 1036 may be any suitable processor capable of executing instructions to process data and perform operations as described herein. By way of example and not limitation, the processor(s) 1018 and 1036 can comprise one or more Central Processing Units (CPUs), Graphics Processing Units (GPUs), or any other device or portion of a device that processes electronic data to transform that electronic data into other electronic data that can be stored in registers and/or memory. In some examples, integrated circuits (e.g., ASICs, etc.), gate arrays (e.g., FPGAs, etc.), and other hardware devices can also be considered processors in so far as they are configured to implement encoded instructions.

The memory 1020 of the computing device(s) 1004 and the memory 1042 of the computing device(s) 1036 are examples of non-transitory computer-readable media. The memory 1020 and 1042 can store an operating system and one or more software applications, instructions, programs, and/or data to implement the methods described herein and the functions attributed to the various systems. In various implementations, the memory 1020 and 1042 can be implemented using any suitable memory technology, such as static random access memory (SRAM), synchronous dynamic RAM (SDRAM), nonvolatile/Flash-type memory, or any other type of memory capable of storing information. The architectures, systems, and individual elements described herein can include many other logical, programmatic, and physical components, of which those shown in the accompanying figures are merely examples that are related to the discussion herein.

In some instances, aspects of some or all of the components discussed herein can include any models, algorithms, and/or machine learning algorithms. For example, in some instances, the components in the memory 1020 and 1042 can be implemented as a neural network.

CONCLUSION

While one or more examples of the techniques described herein have been described, various alterations, additions, permutations and equivalents thereof are included within the scope of the techniques described herein. As can be understood, the components discussed herein are described as divided for illustrative purposes. However, the operations performed by the various components can be combined or performed in any other component. It should also be understood, that components or steps discussed with respect to one example or implementation may be used in conjunction with components or steps of other examples. For example, the components and instructions of FIG. 7 may utilize the processes and flows of FIGS. 1-7.

A non-limiting list of objects may include obstacles in an environment, including but not limited to pedestrians, animals, cyclists, trucks, motorcycles, other vehicles, or the like. Such objects in the environment have a "geometric pose" (which may also be referred to herein as merely "pose") comprising a location and/or orientation of the overall object relative to a frame of reference. In some examples, pose may be indicative of a position of an object (e.g., pedestrian), an orientation of the object, or relative appendage positions of the object. Geometric pose may be described in two-dimensions (e.g., using an x-y coordinate system) or three-dimensions (e.g., using an x-y-z or polar coordinate system), and may include an orientation (e.g., roll, pitch, and/or yaw) of the object. Some objects, such as pedestrians and animals, also have what is referred to herein as "appearance pose." Appearance pose comprises a shape and/or positioning of parts of a body (e.g., appendages, head, torso, eyes, hands, feet, etc.). As used herein, the term "pose" refers to both the "geometric pose" of an object relative to a frame of reference and, in the case of pedestrians, animals, and other objects capable of changing shape and/or positioning of parts of a body, "appearance pose." In some examples, the frame of reference is described with reference to a two- or three-dimensional coordinate system or map that describes the location of objects relative to a vehicle. However, in other examples, other frames of reference may be used.

In the description of examples, reference is made to the accompanying drawings that form a part hereof, which show by way of illustration specific examples of the claimed subject matter. It is to be understood that other examples can be used and that changes or alterations, such as structural changes, can be made. Such examples, changes or alterations are not necessarily departures from the scope with respect to the intended claimed subject matter. While the steps herein may be presented in a certain order, in some cases the ordering may be changed so that certain inputs are provided at different times or in a different order without changing the function of the systems and methods described. The disclosed procedures could also be executed in different orders. Additionally, various computations that are herein need not be performed in the order disclosed, and other examples using alternative orderings of the computations could be readily implemented. In addition to being reordered, the computations could also be decomposed into sub-computations with the same results.

EXAMPLE CLAUSES

A. An system comprising: one or more processors; and one or more non-transitory computer-readable media storing instructions that, when executed by the one or more processors, cause the one or more processors to perform operations comprising: receiving log data associated with a vehicle, at least a portion of the log data a first object in an environment proximate the vehicle; determining a first discretized region and a second discretized region of the environment based at least in part on first map data associated with the log data; associating the first object to the first discretized region based at least in part on a position of the first object relative to the vehicle and a position of the first discretized region to the vehicle; categorizing the portion of log data as a first type of arrangement based at least in part on the first object being associated with the first discretized region; aggregating the log data with additional log data, the additional log data being of the first type of arrangement; generating a statistical model associated with the first type of arrangement based at least in part on the aggregated log data; determining a simulation scenario based at least in part on the statistical model, the simulation scenario comprising a second object in the first discretized region; and executing the simulation scenario based to determine a response of an autonomous vehicle controller to a parameter of the simulation scenario.

B. The system of claim A, the operations further comprising: determining that the first object is associated with a first class of objects; and wherein the categorizing the log data as the first type of arrangement is based at least in part on the first object being associated with the first class of objects.

C. The system of claim A, the operations further comprising: associating the simulation scenario with second map data based at least in part on a feasibility restraint, the feasibility restraint associated with the parameter, the first map data different than the second map data; and wherein executing the simulation scenario is based at least in part on the second map data.

D. The system of claim C, wherein the feasibility restraint is based at least in part on similarities between lane data associated with the first map data and second lane data associated with the second map data.

E. A method comprising: receiving log data associated with a vehicle; assigning a first region and a second region to the log data; identifying a first object within the log data; associating the first object with the first region based at least in part on a position of the first object relative to a position of the vehicle and a position of the first region relative to the position of the vehicle; generating, based at least in part on the association of the first object with the first region, a statistical model; determining a scenario based at least in part on the statistical model, the scenario comprising a second object to be represented in a simulation; and executing the scenario to determine a response of a simulated vehicle controller to the scenario.

F. The method of paragraph E, wherein the first region is part of a plurality of regions, the plurality of regions having a predefined arrangement relative to the position of the vehicle and based at least in part on semantic information contained in map data associated with an environment represented by the log data.

G. The method of paragraph E, wherein assigning the first region and the second region is based at least in part on first map data associated with the log data and the executing the scenario is based at least in part on second map data, the second map data representing a different environment than the first map data.

H. The method of paragraph E, wherein the statistical model is determined based at least in part on parameters associated with the first object, semantic information, and a frequency of occurrence metric associated with the parameters; and determining the scenario comprises sampling the statistical model.

I. The method of paragraph H, wherein the semantic information comprises
at least one lane boundary.

J. The method of paragraph E, further comprising: determining a first parameter associated with the first object based at least in part on the log data; determining a second parameter associated with the vehicle based at least in part on the log data; and wherein generating the statistical model is based at least in part on the first parameter and the second parameter.

K. The method of paragraph E, further comprising: identifying a third object within the log data; and associating the third object with the second region based at least in part on a position of the second object relative to the position of the vehicle and a position of the second region relative to the position of the vehicle.

L. The method of paragraph E, further comprising: identifying a third object within the portion of log data; determining the first object is associated with a first class of objects; determining the third object is associated with a second class of objects; and associating the third object with the first region based at least in part on: a position of the third object relative to the position of the vehicle and the position of the first region relative to the position of the vehicle, the first object being of associated with the first class of objects, and the third object being associated with the second class of objects.

M. The method of paragraph E, 13 further comprising: determining that a number of instances of the first object in the first region associated with the log data fails to meet or exceed a threshold; identifying second data having an instance of a second object in the first region; wherein the scenario is based at least in part on the first object and the second object.

N. A method comprising: determining, based on log data associated with a vehicle, first data representing a first state of objects in an environment associated with the vehicle; determining, based on the first data, a statistical model; sampling the statistical model to determine a simulation parameter; and determining a simulated response of a vehicle controller to a simulation based at least in part on the simulation parameter.

O. The method of paragraph N, further comprising: determining that a number of instances of the first data fails to meet or exceed a scenario threshold associated with the simulation; identifying second data having a second parameter; and wherein the simulation is based at least in part on the first data and the second data.

P. The method of paragraph E, further comprising: determining that the first object is associated with a first class of objects; and wherein the statistical model is determined based at least in part on the first object being associated with the first class.

Q. The method of paragraph E, wherein the discretized representation of the environment is based at least in part on lane demarcations represented in the log data.

R. The method of paragraph E, wherein the statistical model comprises a distribution of parameters associated with a second object in the first region.

S. The method of paragraph E, wherein the statistical model is based at least in part on a frequency of occurrence of the log data corresponding to the first state of objects in a discretized representation.

T. The method of paragraph E, further comprising: generating a scenario based at least in part on the simulation parameter and in part on map data representing a selected environmental feature; and wherein determining the simulated response of the vehicle controller to the simulation is based at least in part on the map data.

While the example clauses described above are described with respect to one particular implementation, it should be understood that, in the context of this document, the content of the example clauses can also be implemented via a method, device, system, a computer-readable medium, and/or another implementation. Additionally, any of examples A-T may be implemented alone or in combination with any other one or more of the examples A-T.

What is claimed is:

1. A system comprising:
one or more processors; and
one or more non-transitory computer-readable media storing instructions that, when executed by the one or more processors, cause the one or more processors to perform operations comprising:
  receiving log data associated with a vehicle, at least a portion of the log data a first object in an environment proximate the vehicle;
  determining a first discretized region and a second discretized region of the environment based at least in part on first map data associated with the log data;
  associating the first object to the first discretized region based at least in part on a position of the first object relative to the vehicle and a position of the first discretized region to the vehicle;
  categorizing the portion of log data as a first type of arrangement based at least in part on the first object being associated with the first discretized region;
  aggregating the log data with additional log data, the additional log data being of the first type of arrangement;
  generating a statistical model associated with the first type of arrangement based at least in part on the aggregated log data;
  determining a simulation scenario based at least in part on the statistical model, the simulation scenario comprising a second object in the first discretized region; and
  executing the simulation scenario to determine a response of an autonomous vehicle controller to a parameter of the simulation scenario.

2. The system as recited in claim 1, the operations further comprising:
  determining that the first object is associated with a first class of objects; and
  wherein the categorizing the log data as the first type of arrangement is based at least in part on the first object being associated with the first class of objects.

3. The system as recited in claim 1, the operations further comprising:
  associating the simulation scenario with second map data based at least in part on a feasibility restraint, the feasibility restraint associated with the parameter, the first map data different than the second map data; and
  wherein executing the simulation scenario is based at least in part on the second map data.

4. The system as recited in claim 3, wherein the feasibility restraint is based at least in part on similarities between lane data associated with the first map data and second lane data associated with the second map data.

5. A method comprising:
  receiving log data associated with a vehicle;
  assigning a first region and a second region to the log data;
  identifying a first object within the log data;
  associating the first object with the first region based at least in part on a position of the first object relative to a position of the vehicle and a position of the first region relative to the position of the vehicle;
  categorizing a portion of log data as a first type of arrangement based at least in part on the first object being associated with the first region;
  aggregating the log data with additional log data, the additional log data being of the first type of arrangement;
  generating, based at least in part on the aggregated log data, a statistical model;
  determining a scenario based at least in part on the statistical model, the scenario comprising a second object to be represented in a simulation; and
  executing the scenario to determine a response of a simulated vehicle controller to the scenario.

6. The method as recited in claim 5, wherein the first region is part of a plurality of regions, the plurality of regions having a predefined arrangement relative to the position of the vehicle and based at least in part on semantic information contained in map data associated with an environment represented by the log data.

7. The method as recited in claim 5, wherein assigning the first region and the second region is based at least in part on first map data associated with the log data and the executing the scenario is based at least in part on second map data, the second map data representing a different environment than the first map data.

8. The method as recited in claim 5, wherein:
  the statistical model is determined based at least in part on parameters associated with the first object, semantic information, and a frequency of occurrence metric associated with the parameters; and determining the scenario comprises sampling the statistical model.

9. The method as recited in claim 8, wherein the semantic information comprises
at least one lane boundary.

10. The method as recited in claim 5, further comprising:
determining a first parameter associated with the first object based at least in part on the log data;
determining a second parameter associated with the vehicle based at least in part on the log data; and
wherein generating the statistical model is based at least in part on the first parameter and the second parameter.

11. The method as recited in claim 5, further comprising:
identifying a third object within the log data; and
associating the third object with the second region based at least in part on a position of the second object relative to the position of the vehicle and a position of the second region relative to the position of the vehicle.

12. The method as recited in claim 5, further comprising:
identifying a third object within the portion of log data;
determining the first object is associated with a first class of objects;
determining the third object is associated with a second class of objects; and
associating the third object with the first region based at least in part on:
a position of the third object relative to the position of the vehicle and the position of the first region relative to the position of the vehicle,
the first object being of associated with the first class of objects, and
the third object being associated with the second class of objects.

13. The method as recited in claim 5, further comprising:
determining that a number of instances of the first object in the first region associated with the log data fails to meet or exceed a threshold;
identifying second data having an instance of a second object in the first region;
wherein the scenario is based at least in part on the first object and the second object.

14. A method comprising:
determining, based on log data associated with a vehicle, first data representing a first state of objects in an environment associated with the vehicle;
determining, based on the first data, a statistical model, the statistical model is based at least in part on a frequency of occurrence of the log data corresponding to the first state of objects in a discretized representation;
sampling the statistical model to determine a simulation parameter; and
determining a simulated response of a vehicle controller to a simulation based at least in part on the simulation parameter.

15. The method as recited in claim 14, further comprising:
determining that a number of instances of the first data fails to meet or exceed a scenario threshold associated with the simulation;
identifying second data having a second parameter; and
wherein the simulation is based at least in part on the first data and the second data.

16. The method as recited in claim 14, further comprising:
determining that the first state objects is associated with a first class of objects; and
wherein the statistical model is determined based at least in part on the first class.

17. The method as recited in claim 14, wherein the discretized representation of the environment is based at least in part on lane demarcations represented in the log data.

18. The method as recited in claim 14, wherein the statistical model comprises a distribution of parameters associated with a second object.

19. The method as recited in claim 14, further comprising:
generating a scenario based at least in part on the simulation parameter and in part on map data representing a selected environmental feature; and
wherein determining the simulated response of the vehicle controller to the simulation is based at least in part on the map data.

20. The method as recited in claim 14, further comprising:
determining a first parameter associated with a first object in the environment based at least in part on the log data;
determining a second parameter associated with the vehicle based at least in part on the log data; and
wherein generating the statistical model is based at least in part on the first parameter and the second parameter.

* * * * *